(12) United States Patent
Khaderbad et al.

(10) Patent No.: US 11,362,212 B2
(45) Date of Patent: Jun. 14, 2022

(54) CONTACT INTERFACE ENGINEERING FOR REDUCING CONTACT RESISTANCE

(71) Applicant: Taiwan Semiconductor Manufacturing Company, Ltd., Hsinchu (TW)

(72) Inventors: Mrunal A Khaderbad, Hsinchu (TW); Keng-Chu Lin, Ping-Tung (TW); Sung-Li Wang, Zhubei (TW)

(73) Assignee: Taiwan Semiconductor Manufacturing Company, Ltd., Hsinchu (CN)

( * ) Notice: Subject to any disclaimer, the term of this patent is extended or adjusted under 35 U.S.C. 154(b) by 0 days.

(21) Appl. No.: 16/572,812

(22) Filed: Sep. 17, 2019

(65) Prior Publication Data
US 2021/0083119 A1   Mar. 18, 2021

(51) Int. Cl.
| H01L 21/768 | (2006.01) |
| H01L 29/78 | (2006.01) |
| H01L 29/66 | (2006.01) |
| H01L 29/417 | (2006.01) |

(52) U.S. Cl.
CPC .... *H01L 29/7851* (2013.01); *H01L 21/76831* (2013.01); *H01L 29/41791* (2013.01); *H01L 29/66795* (2013.01)

(58) Field of Classification Search
CPC .................................................. H01L 23/5226
See application file for complete search history.

(56) References Cited

U.S. PATENT DOCUMENTS

| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |
| 8,860,148 | B2 | 10/2014 | Hu et al. |
| 9,105,490 | B2 | 8/2015 | Wang et al. |
| 9,236,267 | B2 | 1/2016 | De et al. |
| 9,236,300 | B2 | 1/2016 | Liaw |
| 9,406,804 | B2 | 8/2016 | Huang et al. |
| 9,443,769 | B2 | 9/2016 | Wang et al. |
| 9,520,482 | B1 | 12/2016 | Chang et al. |
| 9,548,366 | B1 | 1/2017 | Ho et al. |
| 9,576,814 | B2 | 2/2017 | Wu et al. |
| 9,831,183 | B2 | 11/2017 | Lin et al. |

(Continued)

FOREIGN PATENT DOCUMENTS

WO   2019171872 A1   9/2019

OTHER PUBLICATIONS

Chien, Y. et al., "A Design for Selective Wet Etching of Si3N4/SiO2 in Phosphoric Acid Using a Single Wafer Processor," Journal of the Electrochemical Society, 165 (4), Mar. 22, 2018, pp. H3187-H3191.

(Continued)

*Primary Examiner* — Suberr L Chi
(74) *Attorney, Agent, or Firm* — Slater Matsil, LLP

(57) ABSTRACT

A structure includes a transistor including a first source/drain region, a source/drain contact plug over and electrically coupling to the first source/drain region, and a via over and contacting the source/drain contact plug. The via has a bottom portion having a first length, and an upper portion having a second length. The first length is greater than the second length. Both of the first length and the second length are measured in a same direction parallel to a top surface of the source/drain contact plug.

20 Claims, 35 Drawing Sheets

(56) References Cited

U.S. PATENT DOCUMENTS

| | | |
|---|---|---|
| 9,859,386 B2 | 1/2018 | Ho et al. |
| 2006/0223325 A1 | 10/2006 | Hamada et al. |
| 2008/0026564 A1 | 1/2008 | Frohberg et al. |
| 2008/0122090 A1 | 5/2008 | Hsu et al. |
| 2010/0044869 A1 | 2/2010 | Zhang et al. |
| 2019/0252250 A1 | 8/2019 | You et al. |
| 2019/0273042 A1 | 9/2019 | Cheng et al. |
| 2021/0043663 A1 | 2/2021 | Yokoyama et al. |

OTHER PUBLICATIONS

Gall, D., "Electron mean free path in elemental metals," Journal of Applied Physics 119, Feb. 2016, 5 pages.

Oda, H., et al., "Optimizing the SiC Plasma Etching Process for Manufacturing Power Devices," CS Mantech Conference, Scottsdale, Arizona, May 18-21, 2015, pp. 125-128.

Reyes-Betanzo, C., et al., "Plasma Etching of Silicon Nitride with High Selectivity over Silicon Oxide and Silicon in Fluorine Containing Plasmas," Journal of Vacuum Science & Technology, A17(6), 1 page.

Yang, J, et al., "Researching the Aluminum Nitride Etching Process for Application in MEMS Resonators," Micromachines, Feb. 6, 2015, pp. 281-290.

Zhou, B., et al., "Kinetics and Modeling of Wet Etching of Aluminum Oxide by Warm Phosphoric Acid," Journal of the Electrochemical Society, vol. 143, No. 2, Feb. 1996, pp. 619-623.

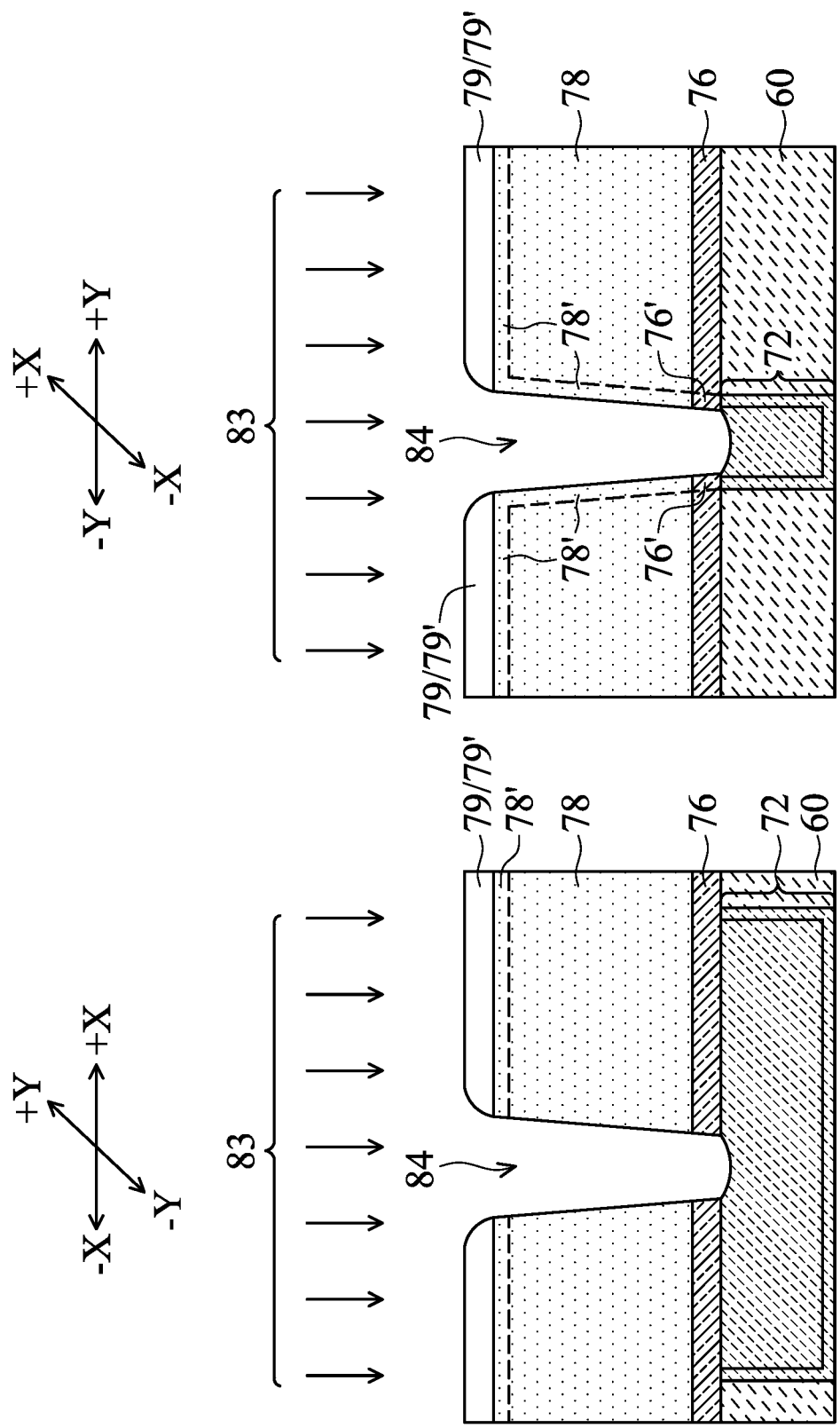

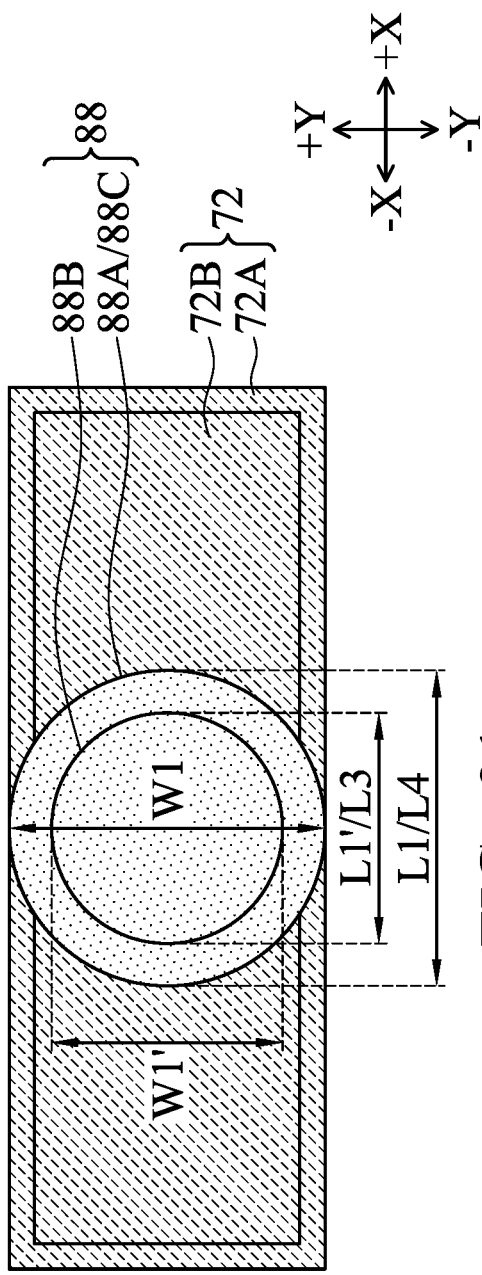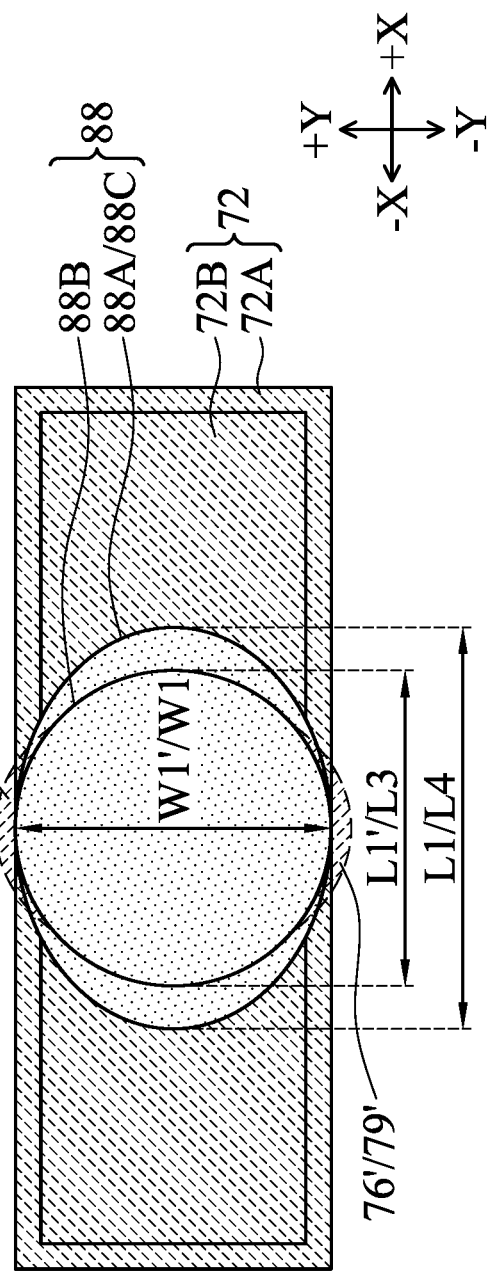

CONTACT INTERFACE ENGINEERING FOR REDUCING CONTACT RESISTANCE

BACKGROUND

With the continuing reduction in the dimensions of integrated circuits, new challenges also emerge. For example, the contact resistance between conductive features started to dominate the resistance of the integrated circuits. An example is the contact resistance between source/drain contact plugs and the respective overlying vias, which resistance may be high due to the small sizes of the contact area between the source/drain contact plug and the via. The high contact resistance value significantly affects the drive current of the transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 27A, 27B, 28A, 28B, 29A, 29B, 30A, and 30B illustrate the cross-sectional views of intermediate stages in the formation of a via in accordance with some embodiments.

FIGS. 31 and 32 illustrate the plane views of vias in accordance with some embodiments.

DETAILED DESCRIPTION

Figure 1:
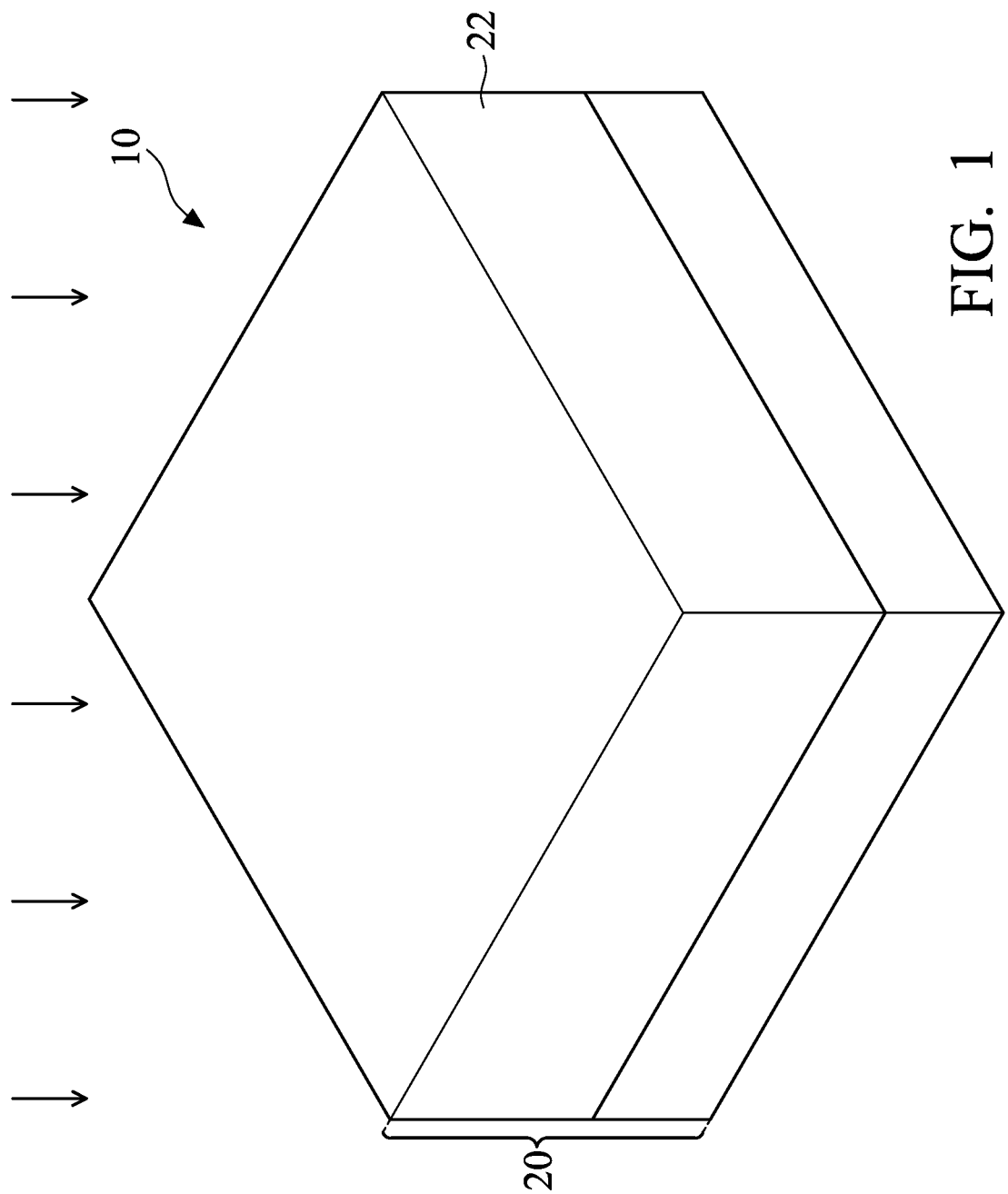
FIGS. 1-6, 7A, 7B, and 8-11 illustrate the perspective views and cross-sectional views of intermediate stages in the formation of a Fin Field-Effect Transistor (FinFET) and the respective source/drain contact plugs in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistors including source/drain contact plugs, the overlying vias, and the methods of forming the same are provided in accordance with various embodiments. The intermediate stages of forming the transistors and the vias are illustrated in accordance with some embodiments. Some variations of some embodiments are discussed. Throughout the various views and illustrative embodiments, like reference numbers are used to designate like elements. In the illustrated embodiments, the formation of Fin Field-Effect Transistors (FinFETs) is used as an example to explain the concept of the present disclosure. Other types of transistors such as nanowire transistors, nano-sheet transistors, planar transistors, and the like may also adopt the concept of the present disclosure. Although method embodiments may be discussed as being performed in a particular order, other method embodiments may be performed in any logical order. In accordance with some embodiments of the present disclosure, a via is formed over and contacting a source/drain contact plug of a transistor. The bottom portion of the via is expanded laterally to increase the contact area between the via and the source/drain contact plug, so that contact resistance is reduced. The top portion of the via may also be expanded laterally to increase the contact area between the via and the overlying conductive feature (such as a metal line) to reduce the corresponding contact resistance.

Figure 38:
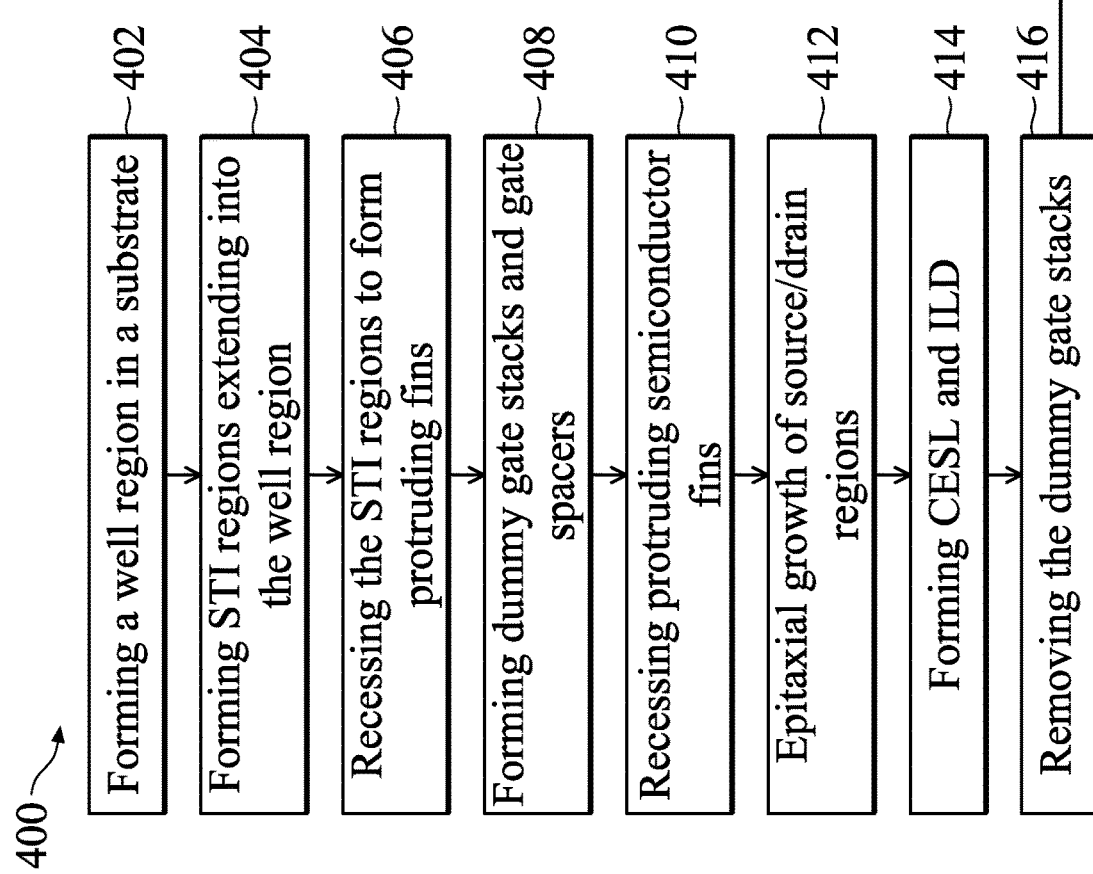
FIG. 38 illustrates a process flow for forming a FinFET and vias in accordance with some embodiments.

FIGS. 1-6, 7A, 7B, 8-13, 14A, 14B, 15A, 15B, 16A, 16B, 17A, 17B, 18A, 18B, 20A, and 20B illustrate the perspective view and cross-sectional views of intermediate stages in the formation of a FinFET and the corresponding vias in accordance with some embodiments of the present disclosure. The processes shown in these figures are also reflected schematically in the process flow 400 as shown in FIG. 38.

In FIG. 1, substrate 20 is provided. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon substrate or a glass substrate. Other substrates such as a multi-layered or gradient substrate may also be used. In some embodiments, the semiconductor material of semiconductor substrate 20 may include silicon; germanium; a compound semiconductor including silicon carbide, SiPC, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Further referring to FIG. 1, well region 22 is formed in substrate 20. The respective process is illustrated as process 402 in the process flow 400 shown in FIG. 38. In accordance with some embodiments of the present disclosure, well region 22 is a p-type well region formed through implanting a p-type impurity, which may be boron, indium, or the like, into substrate 20. In accordance with other embodiments of the present disclosure, well region 22 is an n-type well region formed through implanting an n-type impurity, which may be phosphorus, arsenic, antimony, or the like, into substrate 20. The resulting well region 22 may extend to the top surface of substrate 20. The n-type or p-type impurity concentration may be equal to or less than $10^{18}$ cm$^{-3}$, such as in the range between about $10^{17}$ cm$^{-3}$ and about $10^{18}$ cm$^{-3}$.

Figure 2:
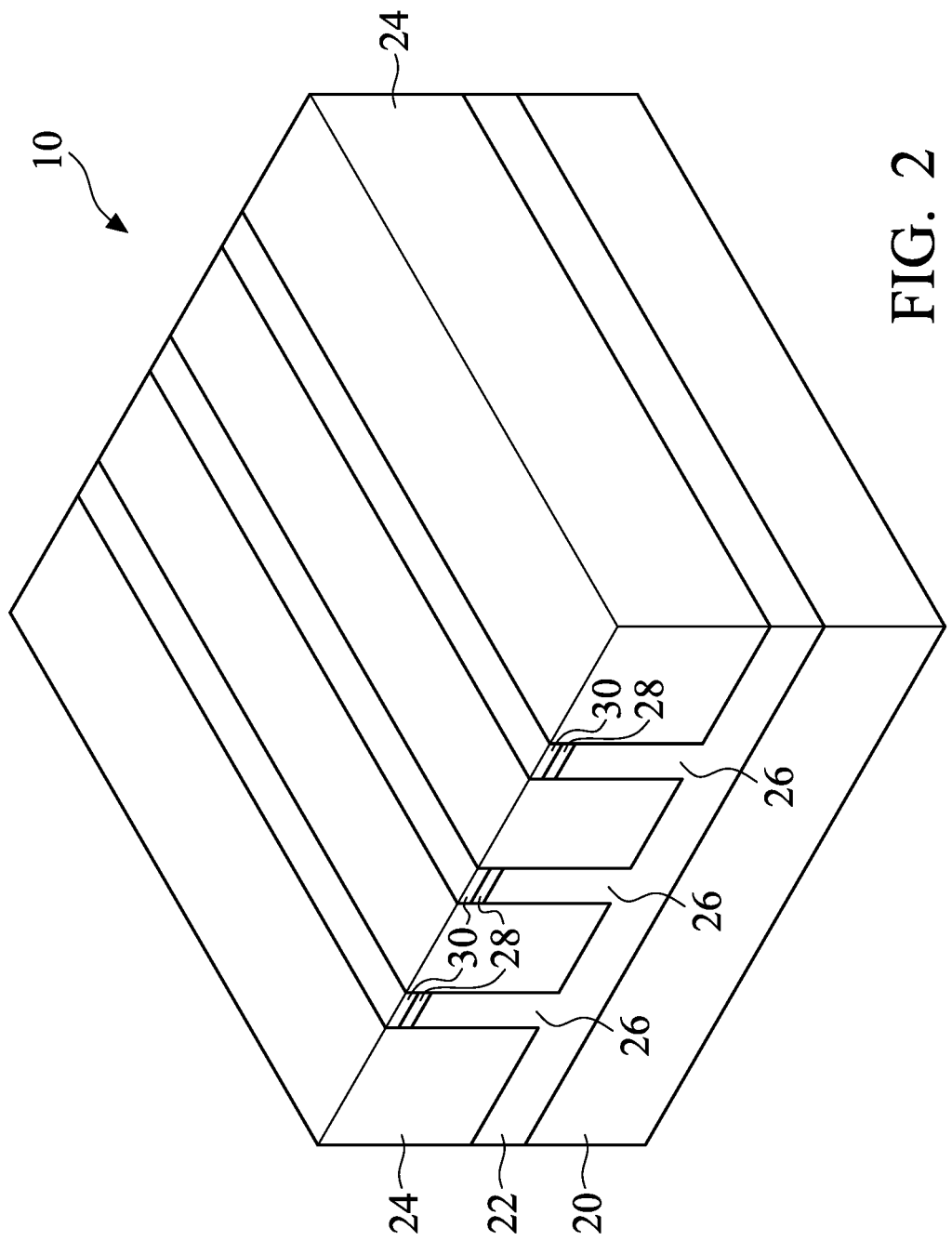

Referring to FIG. 2, isolation regions 24 are formed to extend from a top surface of substrate 20 into substrate 20. Isolation regions 24 are alternatively referred to as Shallow Trench Isolation (STI) regions hereinafter. The respective process is illustrated as process 404 in the process flow 400 shown in FIG. 38. The portions of substrate 20 between neighboring STI regions 24 are referred to as semiconductor strips 26. To form STI regions 24, pad oxide layer 28 and hard mask layer 30 are formed on semiconductor substrate 20, and are then patterned. Pad oxide layer 28 may be a thin film formed of silicon oxide. In accordance with some embodiments of the present disclosure, pad oxide layer 28 is formed in a thermal oxidation process, wherein a top surface layer of semiconductor substrate 20 is oxidized. Pad oxide layer 28 acts as an adhesion layer between semiconductor substrate 20 and hard mask layer 30. Pad oxide layer 28 may also act as an etch stop layer for etching hard mask layer 30. In accordance with some embodiments of the present disclosure, hard mask layer 30 is formed of silicon nitride, for example, using Low-Pressure Chemical Vapor Deposition (LPCVD). In accordance with other embodiments of the present disclosure, hard mask layer 30 is formed by thermal nitridation of silicon, or Plasma Enhanced Chemical Vapor Deposition (PECVD). A photo resist (not shown) is formed on hard mask layer 30 and is then patterned. Hard mask layer 30 is then patterned using the patterned photo resist as an etching mask to form hard masks 30 as shown in FIG. 2.

Next, the patterned hard mask layer 30 is used as an etching mask to etch pad oxide layer 28 and substrate 20, followed by filling the resulting trenches in substrate 20 with a dielectric material(s). A planarization process such as a Chemical Mechanical Polish (CMP) process or a mechanical grinding process is performed to remove excessing portions of the dielectric materials, and the remaining portions of the dielectric materials(s) are STI regions 24. STI regions 24 may include a liner dielectric (not shown), which may be a thermal oxide formed through a thermal oxidation of a surface layer of substrate 20. The liner dielectric may also be a deposited silicon oxide layer, silicon nitride layer, or the like formed using, for example, Atomic Layer Deposition (ALD), High-Density Plasma Chemical Vapor Deposition (HDPCVD), or Chemical Vapor Deposition (CVD). STI regions 24 may also include a dielectric material over the liner oxide, wherein the dielectric material may be formed using Flowable Chemical Vapor Deposition (FCVD), spin-on coating, or the like. The dielectric material over the liner dielectric may include silicon oxide in accordance with some embodiments.

The top surfaces of hard masks 30 and the top surfaces of STI regions 24 may be substantially level with each other. Semiconductor strips 26 are between neighboring STI regions 24. In accordance with some embodiments of the present disclosure, semiconductor strips 26 are parts of the original substrate 20, and hence the material of semiconductor strips 26 is the same as that of substrate 20. In accordance with alternative embodiments of the present disclosure, semiconductor strips 26 are replacement strips formed by etching the portions of substrate 20 between STI regions 24 to form recesses, and performing an epitaxy to regrow another semiconductor material in the recesses. Accordingly, semiconductor strips 26 are formed of a semiconductor material different from that of substrate 20. In accordance with some embodiments, semiconductor strips 26 are formed of silicon germanium, silicon carbon, or a III-V compound semiconductor material.

Figure 3:
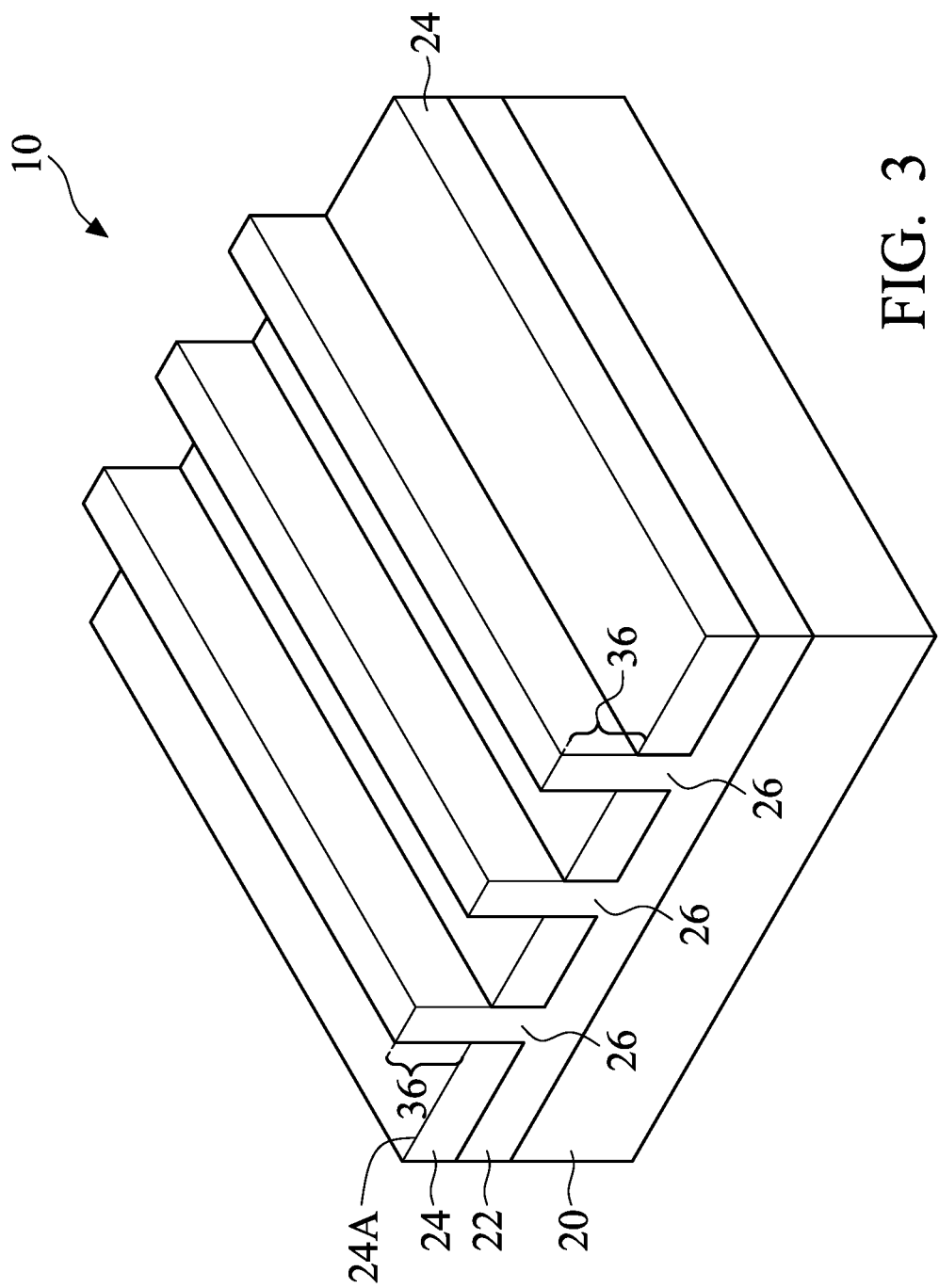

Referring to FIG. 3, STI regions 24 are recessed, so that the top portions of semiconductor strips 26 protrude higher than the top surfaces 24A of the remaining portions of STI regions 24 to form protruding fins 36. The respective process is illustrated as process 406 in the process flow 400 shown in FIG. 38. The etching may be performed using a dry etching process, wherein HF$_3$ and NH$_3$, for example, are used as the etching gases. During the etching process, plasma may be generated. Argon may also be included. In accordance with alternative embodiments of the present disclosure, the recessing of STI regions 24 is performed using a wet etch process. The etching chemical may include HF, for example.

Protruding fins 36 may be formed of or replaced with other semiconductor materials. For example, for NMOS transistors, protruding fins 36 may be formed of or comprise Si, SiP, SiC, SiPC, or III-V compound semiconductor (such as InP, GaAs, AlAs, InAs, InAlAs, InGaAs, or the like). For PMOS transistors, protruding fins 36 may be formed of or comprise Si, SiGe, SiGeB, Ge or a III-V compound semiconductor (such as InSb, GaSb, InGaSb, or the like).

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
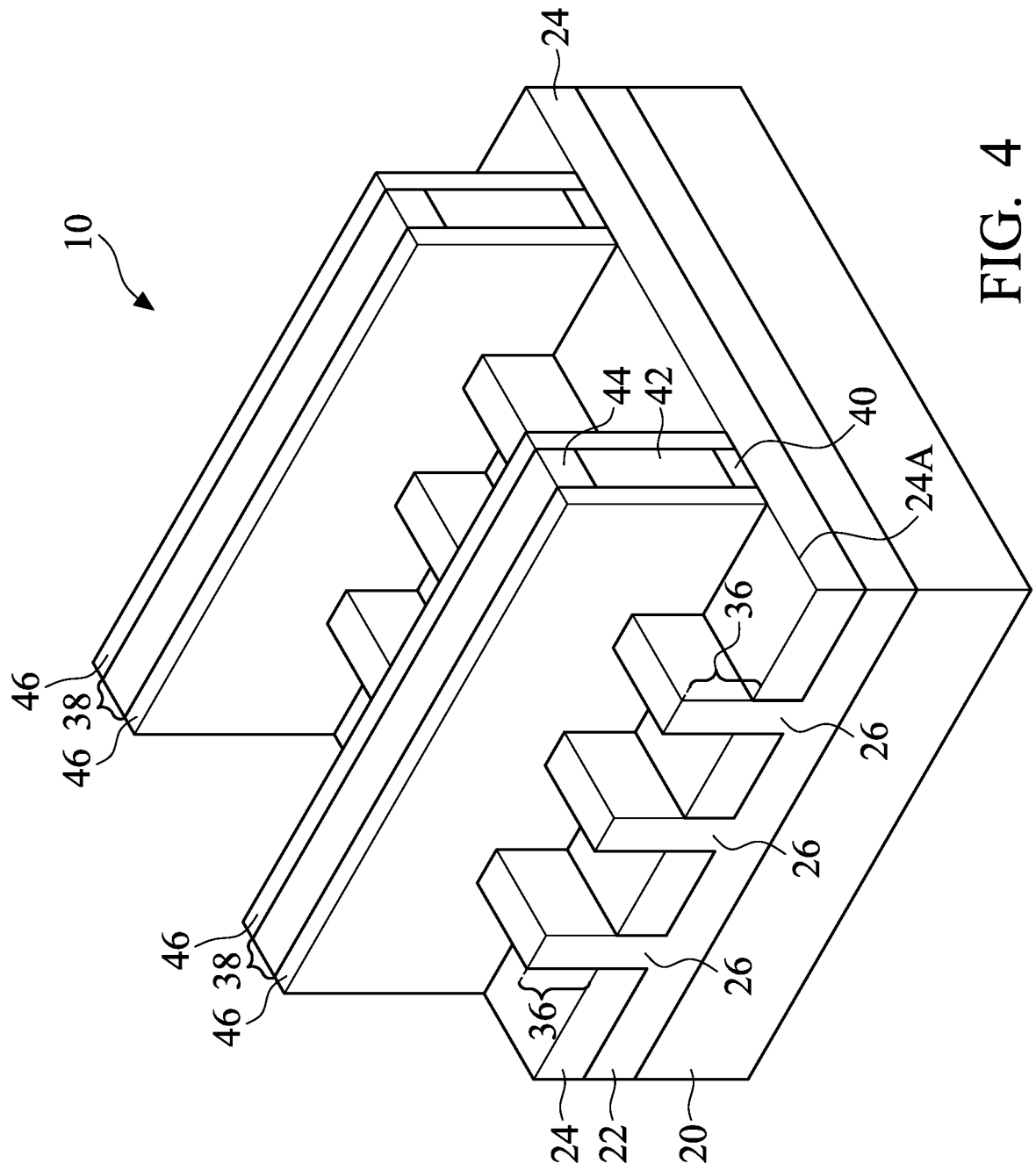

Referring to FIG. 4, dummy gate stacks 38 are formed to extend on the top surfaces and the sidewalls of (protruding) fins 36. The respective process is illustrated as process 408 in the process flow 400 shown in FIG. 38. Dummy gate stacks 38 may include dummy gate dielectrics 40 and dummy gate electrodes 42 over dummy gate dielectrics 40. Dummy gate electrodes 42 may be formed, for example, using polysilicon, and other materials may also be used. Each of dummy gate stacks 38 may also include one (or a plurality of) hard mask layer 44 over dummy gate electrodes 42. Hard mask layers 44 may be formed of silicon nitride, silicon oxide, silicon carbo-nitride, or multi-layers thereof. Dummy gate stacks 38 may cross over a single one or a plurality of protruding fins 36 and/or STI regions 24.

Dummy gate stacks 38 also have lengthwise directions perpendicular to the lengthwise directions of protruding fins 36.

Next, gate spacers 46 are formed on the sidewalls of dummy gate stacks 38. The respective process is also shown as process 408 in the process flow 400 shown in FIG. 38. In accordance with some embodiments of the present disclosure, gate spacers 46 are formed of a dielectric material(s) such as silicon nitride, silicon carbo-nitride, or the like, and may have a single-layer structure or a multi-layer structure including a plurality of dielectric layers.

Figure 5:
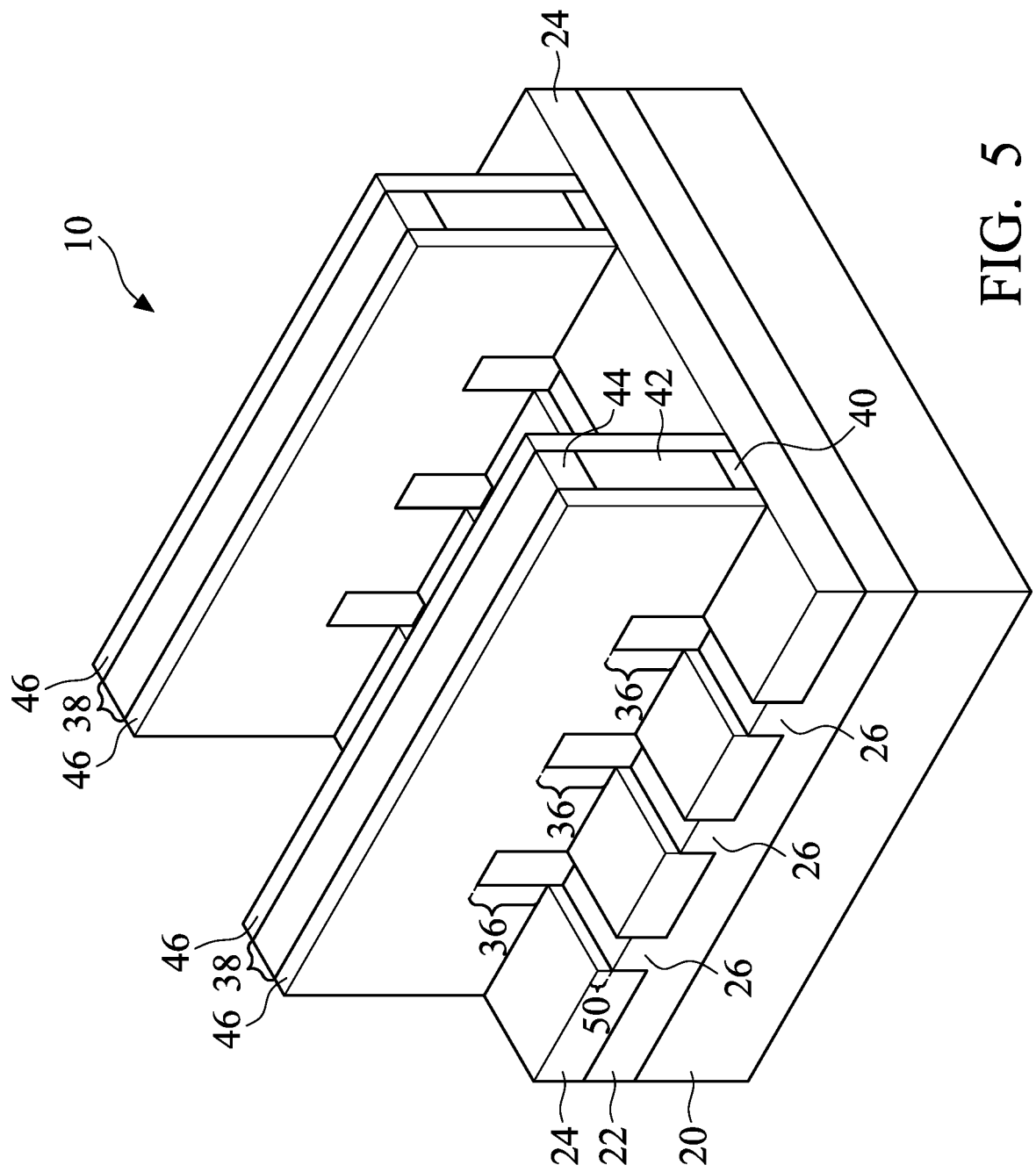

An etching process is then performed to etch the portions of protruding fins 36 that are not covered by dummy gate stacks 38 and gate spacers 46, resulting in the structure shown in FIG. 5. The respective process is illustrated as process 410 in the process flow 400 shown in FIG. 38. The recessing may be anisotropic, and hence the portions of fins 36 directly underlying dummy gate stacks 38 and gate spacers 46 are protected, and are not etched. The top surfaces of the recessed semiconductor strips 26 may be lower than the top surfaces 24A of STI regions 24 in accordance with some embodiments. Recesses 50 are accordingly formed. Recesses 50 comprise portions located on the opposite sides of dummy gate stacks 38, and portions between remaining portions of protruding fins 36.

Figure 6:
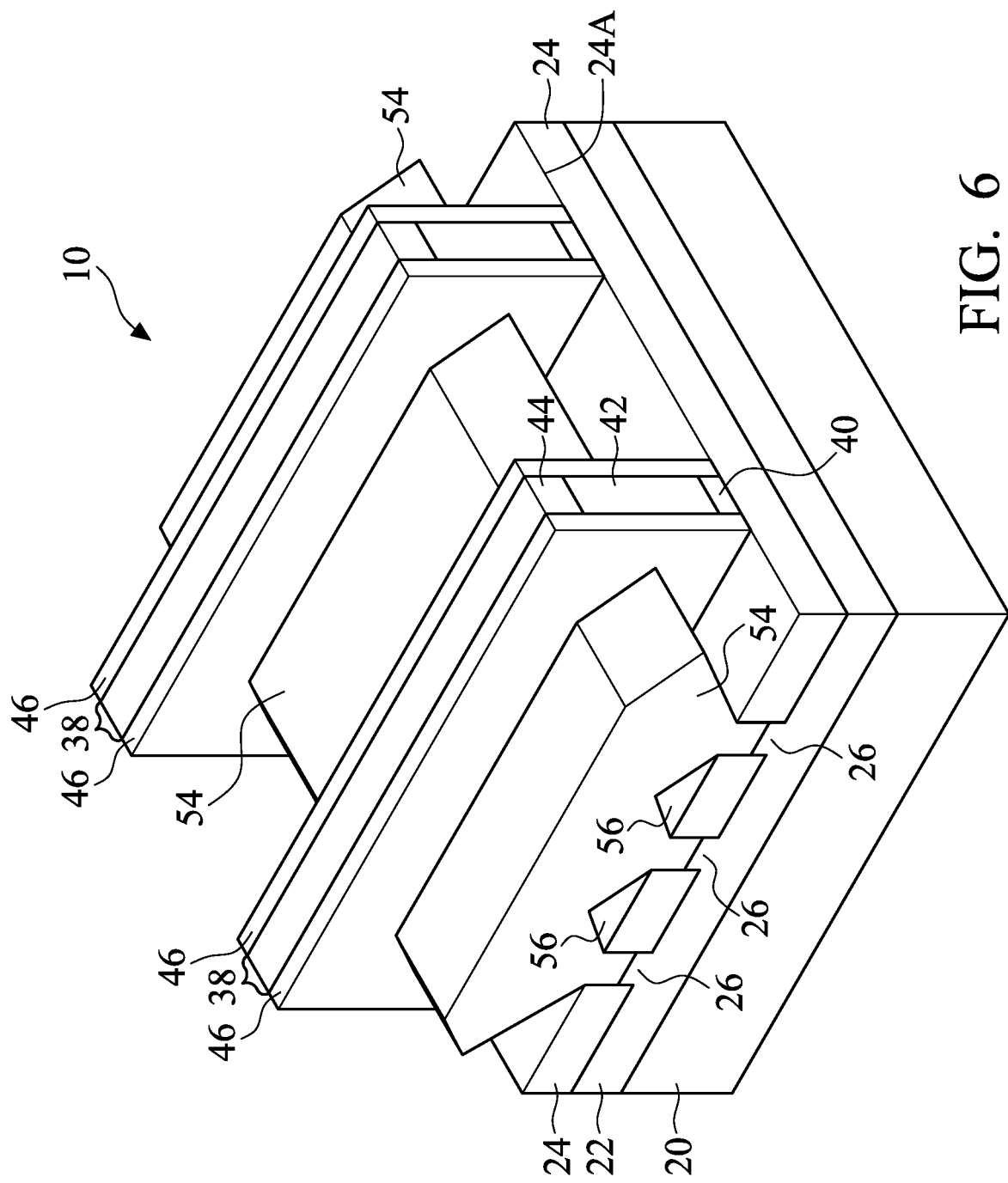

Next, epitaxy regions (source/drain regions) 54 are formed by selectively growing (through epitaxy) a semiconductor material in recesses 50, resulting in the structure in FIG. 6. The respective process is illustrated as process 412 in the process flow 400 shown in FIG. 38. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB) or silicon boron (SiB) may be grown. Conversely, when the resulting FinFET is an n-type FinFET, silicon phosphorous (SiP) or silicon carbon phosphorous (SiCP) may be grown. In accordance with alternative embodiments of the present disclosure, epitaxy regions 54 comprise III-V compound semiconductors such as GaAs, InP, GaN, InGaAs, InAlAs, GaSb, AlSb, AlAs, AlP, GaP, combinations thereof, or multi-layers thereof. After Recesses 50 are filled with epitaxy regions 54, the further epitaxial growth of epitaxy regions 54 causes epitaxy regions 54 to expand horizontally, and facets may be formed. The further growth of epitaxy regions 54 may also cause neighboring epitaxy regions 54 to merge with each other. Voids (air gaps) 56 may be generated. In accordance with some embodiments of the present disclosure, the formation of epitaxy regions 54 may be finished when the top surface of epitaxy regions 54 is still wavy, or when the top surface of the merged epitaxy regions 54 has become planar, which is achieved by further growing on the epitaxy regions 54 as shown in FIG. 6.

After the epitaxy step, epitaxy regions 54 may be further implanted with a p-type or an n-type impurity to form source and drain regions, which are also denoted using reference numeral 54. In accordance with alternative embodiments of the present disclosure, the implantation step is skipped when epitaxy regions 54 are in-situ doped with the p-type or n-type impurity during the epitaxy.

Figure 7A:
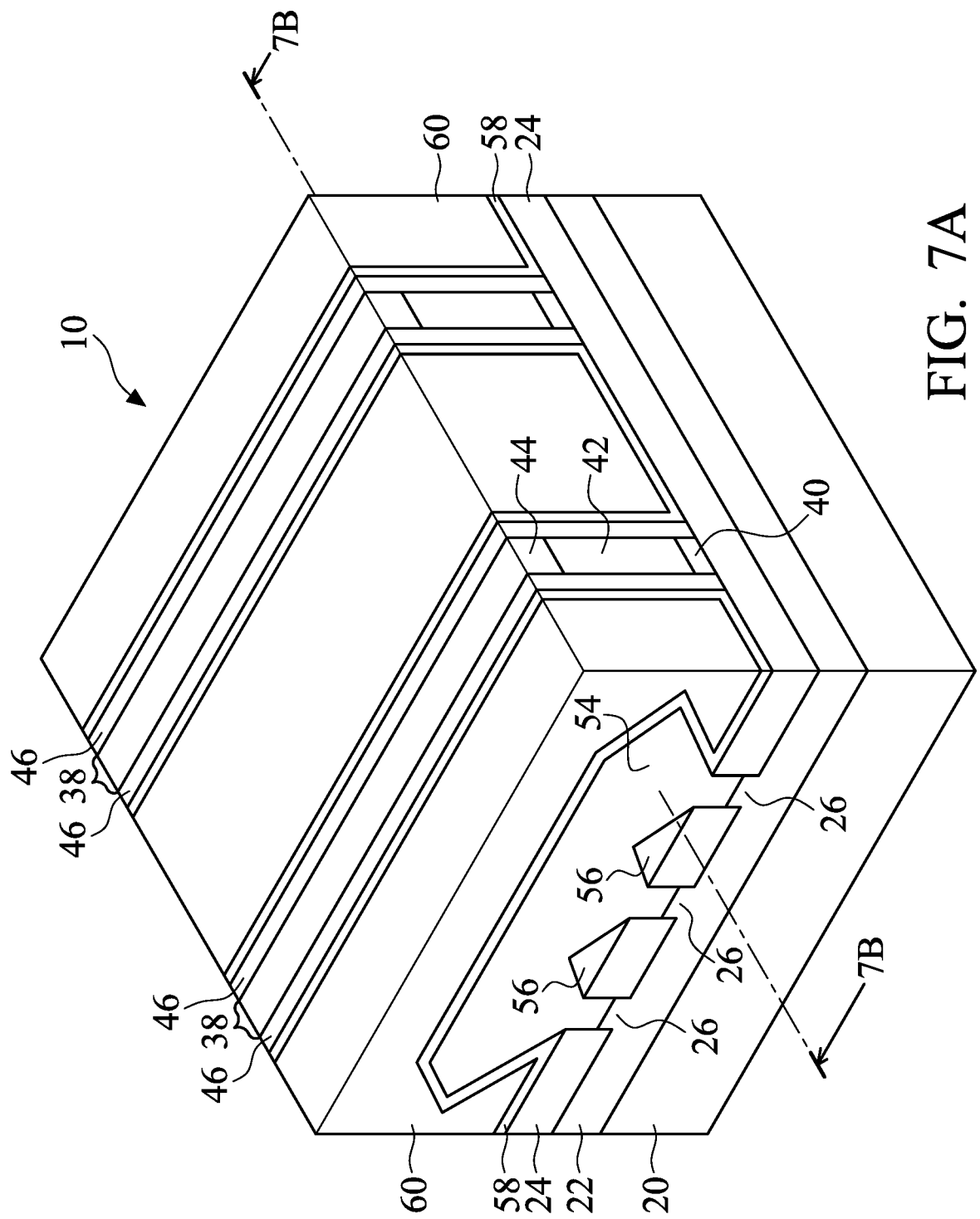

FIG. 7A illustrates a perspective view of the structure after the formation of Contact Etch Stop Layer (CESL) 58 and Inter-Layer Dielectric (ILD) 60. The respective process is illustrated as process 414 in the process flow 400 shown in FIG. 38. CESL 58 may be formed of silicon oxide, silicon nitride, silicon carbo-nitride, silicon oxy-carbide, silicon oxy-nitride, silicon oxy-carbo-nitride, aluminum oxide, aluminum nitride, or the like, and may be formed using CVD, ALD, or the like. ILD 60 may include a dielectric material formed using, for example, FCVD, spin-on coating, CVD, or another deposition method. ILD 60 may be formed of an oxygen-containing dielectric material, which may be a silicon-oxide based material such as silicon oxide, Phospho-Silicate Glass (PSG), Boro-Silicate Glass (BSG), Boron-Doped Phospho-Silicate Glass (BPSG), silicon oxy-carbide, a high-k dielectric material such as zirconium oxide, hafnium oxide, or a low-k dielectric material. A planarization process such as a CMP process or a mechanical grinding process may be performed to level the top surfaces of ILD 60, dummy gate stacks 38, and gate spacers 46 with each other.

Figure 7B:
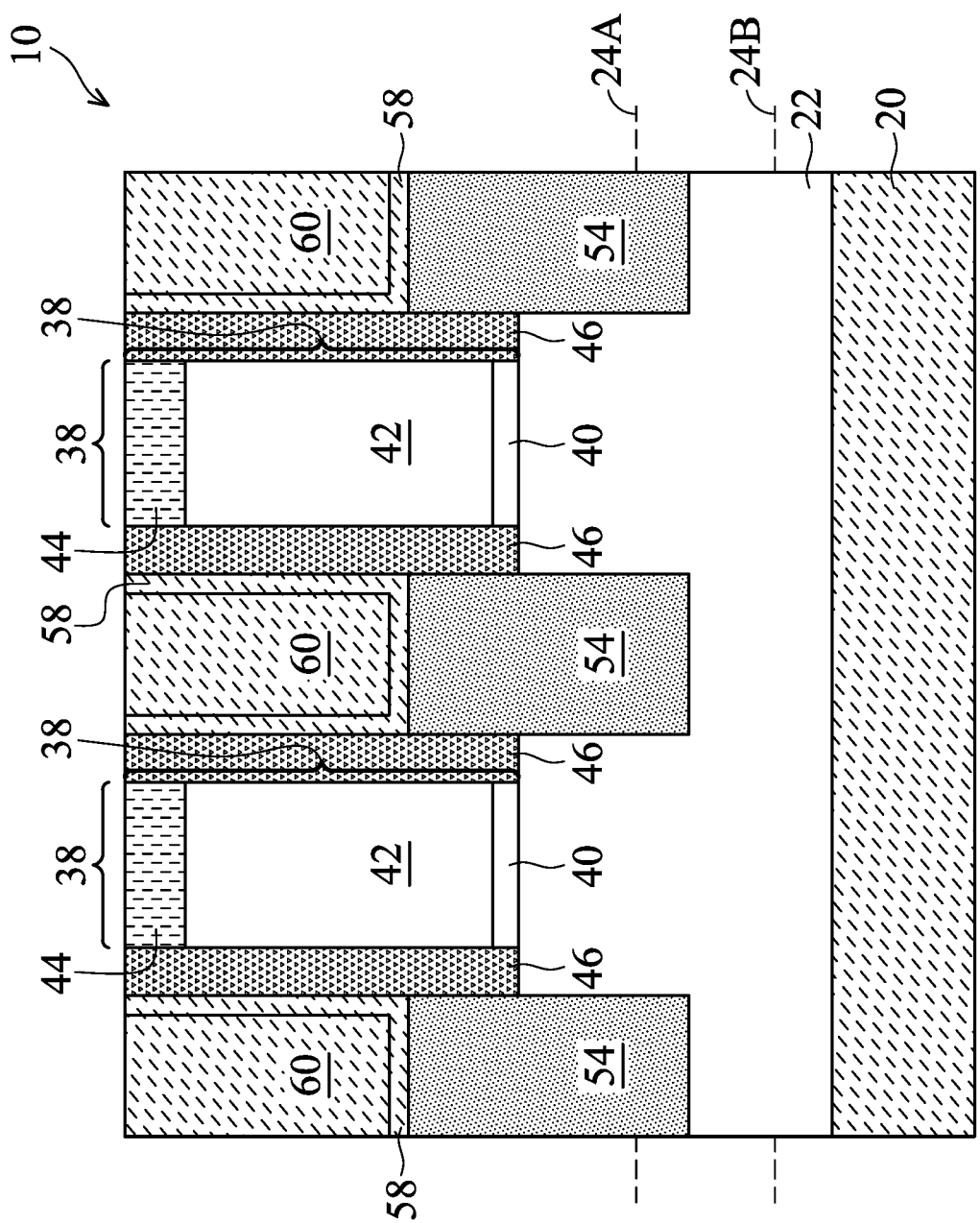
Figure 8:
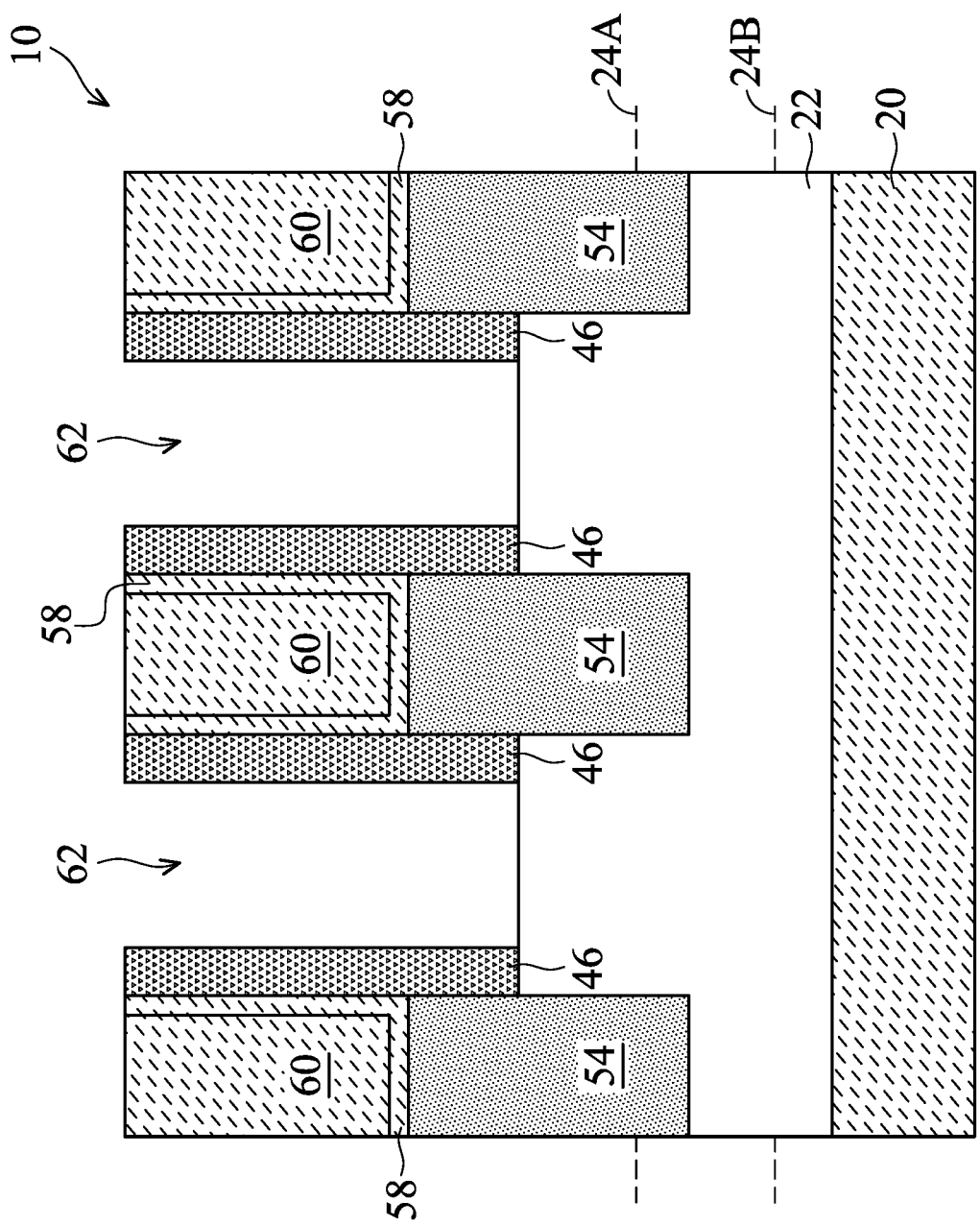
Figure 9:
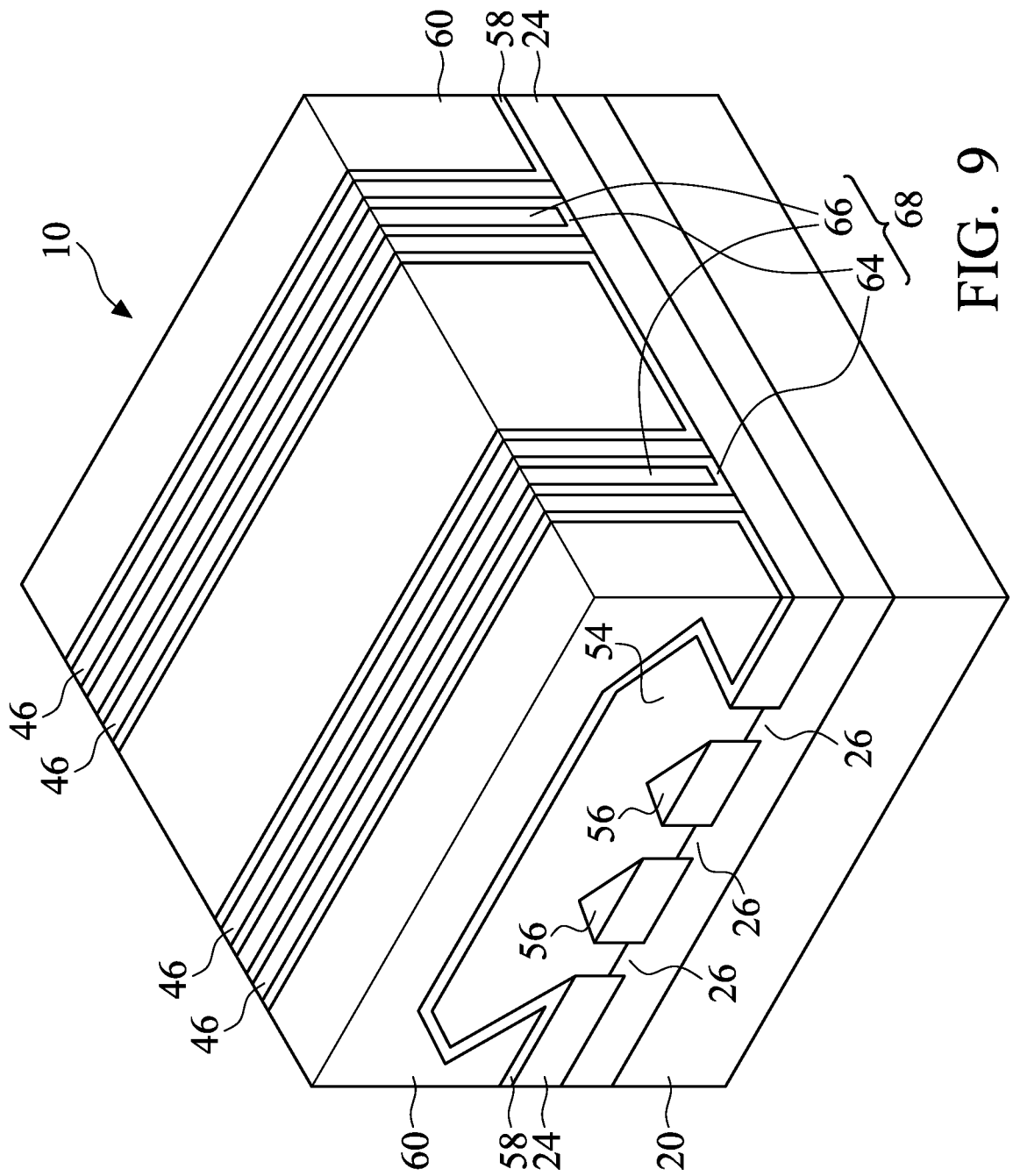

FIG. 7B illustrates the reference cross-section 7B-7B in FIG. 7A, in which dummy gate stacks 38 are illustrated. Next, the dummy gate stacks 38 including hard mask layers 44, dummy gate electrodes 42 and dummy gate dielectrics 40 are etched, forming trenches 62 between gate spacers 46, as shown in FIG. 8. The respective process is illustrated as process 416 in the process flow 400 shown in FIG. 38. The top surfaces and the sidewalls of protruding fins 36 are exposed to trenches 62. Next, as shown in FIG. 9, replacement gate stacks 68 are formed in trenches 62 (FIG. 8). The respective process is illustrated as process 418 in the process flow 400 shown in FIG. 38. Replacement gate stacks 68 include gate dielectrics 64 and the corresponding gate electrodes 66.

In accordance with some embodiments of the present disclosure, the gate dielectric 64 includes an Interfacial Layer (IL) as its lower part. The IL is formed on the exposed surfaces of protruding fins 36. The IL may include an oxide layer such as a silicon oxide layer, which is formed through the thermal oxidation of protruding fins 36, a chemical oxidation process, or a deposition process. Gate dielectric 64 may also include a high-k dielectric layer formed over the IL. The high-k dielectric layer includes a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0, and sometimes as high as 21.0 or higher. The high-k dielectric layer is overlying, and may contact, the IL. In accordance with some embodiments of the present disclosure, the high-k dielectric layer is formed using ALD, CVD, PECVD, Molecular-Beam Deposition (MBD), or the like.

Gate electrode 66 is formed on gate dielectric 64. Gate electrode 66 may include a plurality of stacked layers, which may be formed as conformal layers, and a filling-metal region filling the rest of the trenches 62 unfilled by the plurality of stacked layers. The stacked layers may include a barrier layer, a work function layer over the barrier layer, and one or a plurality of metal capping layers over the work function layer. The filling-metal region may be formed of tungsten, cobalt, or the like. In accordance with alternative embodiments, the barrier layer may not be formed, and the capping layers may fully full the trenches, and the filling-metal region is not formed.

Figure 10:
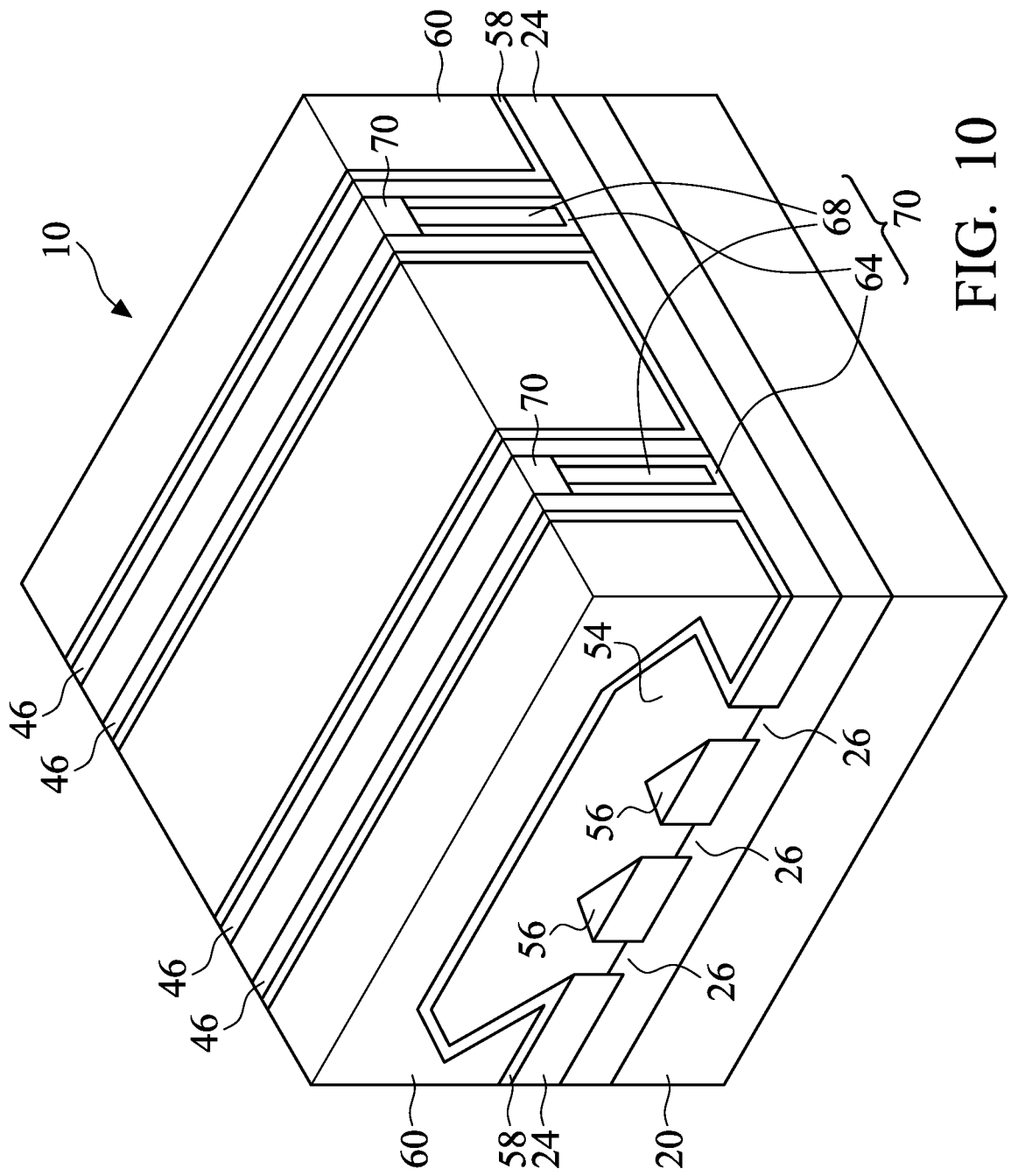

FIG. 10 illustrates the formation of self-aligned hard masks 70 in accordance with some embodiments. The respective process is illustrated as process 420 in the process flow 400 shown in FIG. 38. The formation of hard masks 70 may include performing an etching process to recess gate stacks 68, so that recesses are formed between gate spacers 46, filling the recesses with a dielectric material, and then performing a planarization process such as a CMP process or a mechanical grinding process to remove excess portions of the dielectric material. Hard masks 70 may be formed of silicon nitride, silicon oxynitride, silicon oxy-carbo-nitride, or the like.

Figure 11:
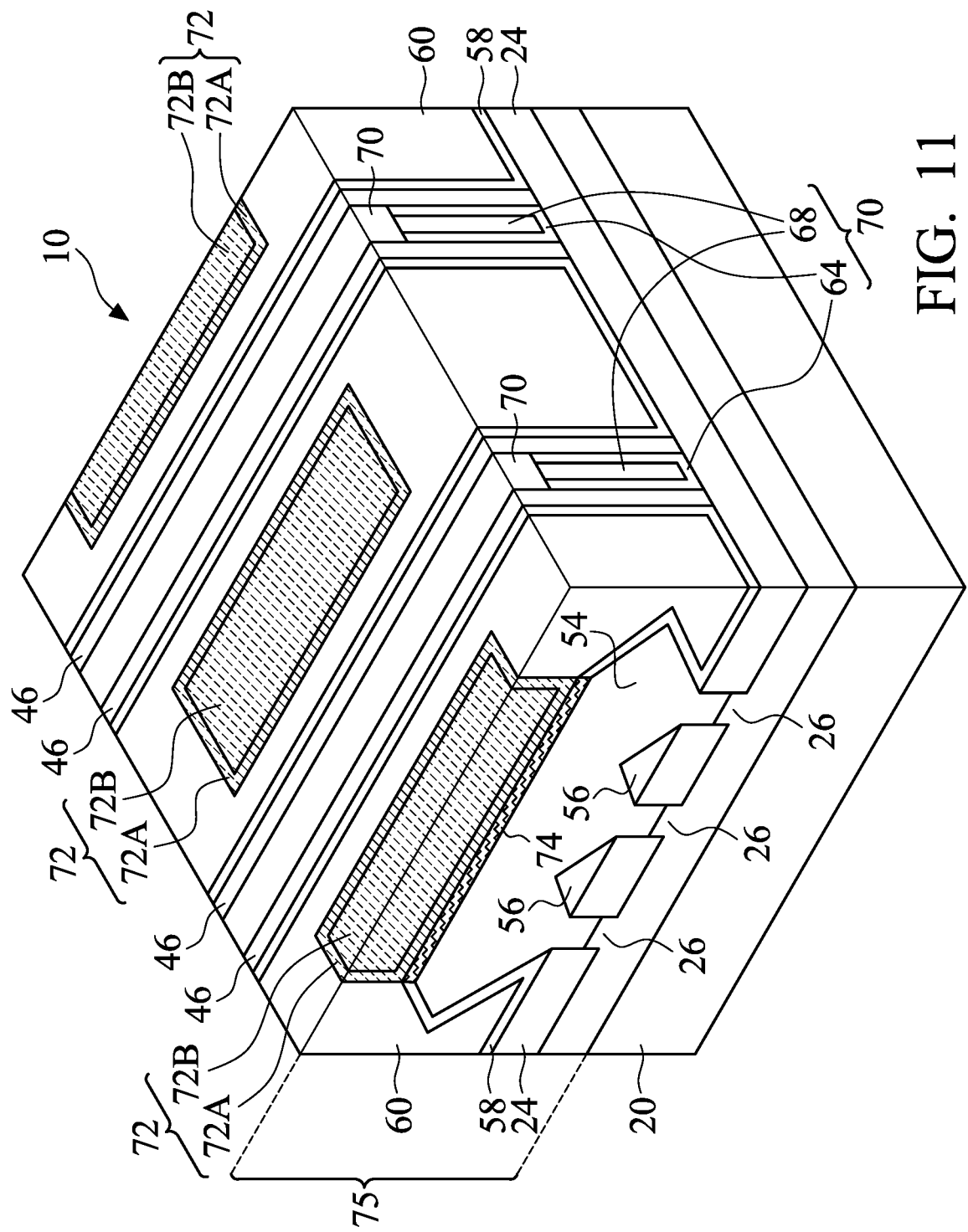

FIG. 11 illustrates the formation of source/drain contact plugs 72. The respective process is illustrated as process 422 in the process flow 400 shown in FIG. 38. The formation of source/drain contact plugs 72 includes etching ILD 60 to expose the underlying portions of CESL 58, and then etching the exposed portions of CESL 58 to reveal source/drain regions 54. In a subsequent process, a metal layer is deposited and extending into the contact openings. The metal layer may be formed of or comprise Ti, Co, Ni, NiCo, Pt, Ni(Pt), Ir, Pt(Ir), Er, Yb, Pd, Rh, or the like, or alloys thereof. A metal nitride capping layer may be formed. An annealing process is then performed to react the metal layer with the top portion of source/drain regions 54 to form silicide regions 74. Next, either the previously formed metal nitride layer is left without being removed, or the previously formed metal nitride layer is removed, followed by the deposition of a new metal nitride layer (such as a titanium nitride layer). The metal nitride layer may be referred to as a barrier, and is shown as barrier 72A. A filling-metallic material 72B such as W, Co, Ru, Ir, Ni, Os, Rh, Al, Mo, alloys thereof, or the like, is then filled into the contact openings, followed by a planarization process to remove excess materials, resulting in source/drain contact plugs 72. The deposition methods of barrier layer 72A and filling-metallic material 72B may include CVD, PVD, Electroless deposition (ELD), Electrical Chemical Plating (ECP) or ALD. FinFETs 75, which may be connected in parallel as one FinFET, is thus formed.

In accordance with some embodiments of the present disclosure, for example, when filling-metallic material 72B comprises cobalt, source/drain contact plugs 72 may be recessed slightly, and another metal such as tungsten may be selectively deposited on the recessed source/drain contact plugs 72. This may be performed when the subsequent via 88 (FIG. 20A) comprises Ru, which is not compatible with cobalt, so that tungsten or the like material is used as a buffer.

FIGS. 12, 13, 14A, 14B, 15A, 15B, 16A, 16B, 17A, 17B, 18A, 18B, 20A, and 20B illustrate the perspective views and cross-sectional views of intermediate stages in the formation of vias in accordance with some embodiments. The vias are formed over, and landed on, source/drain contact plugs 72.

Figure 12:
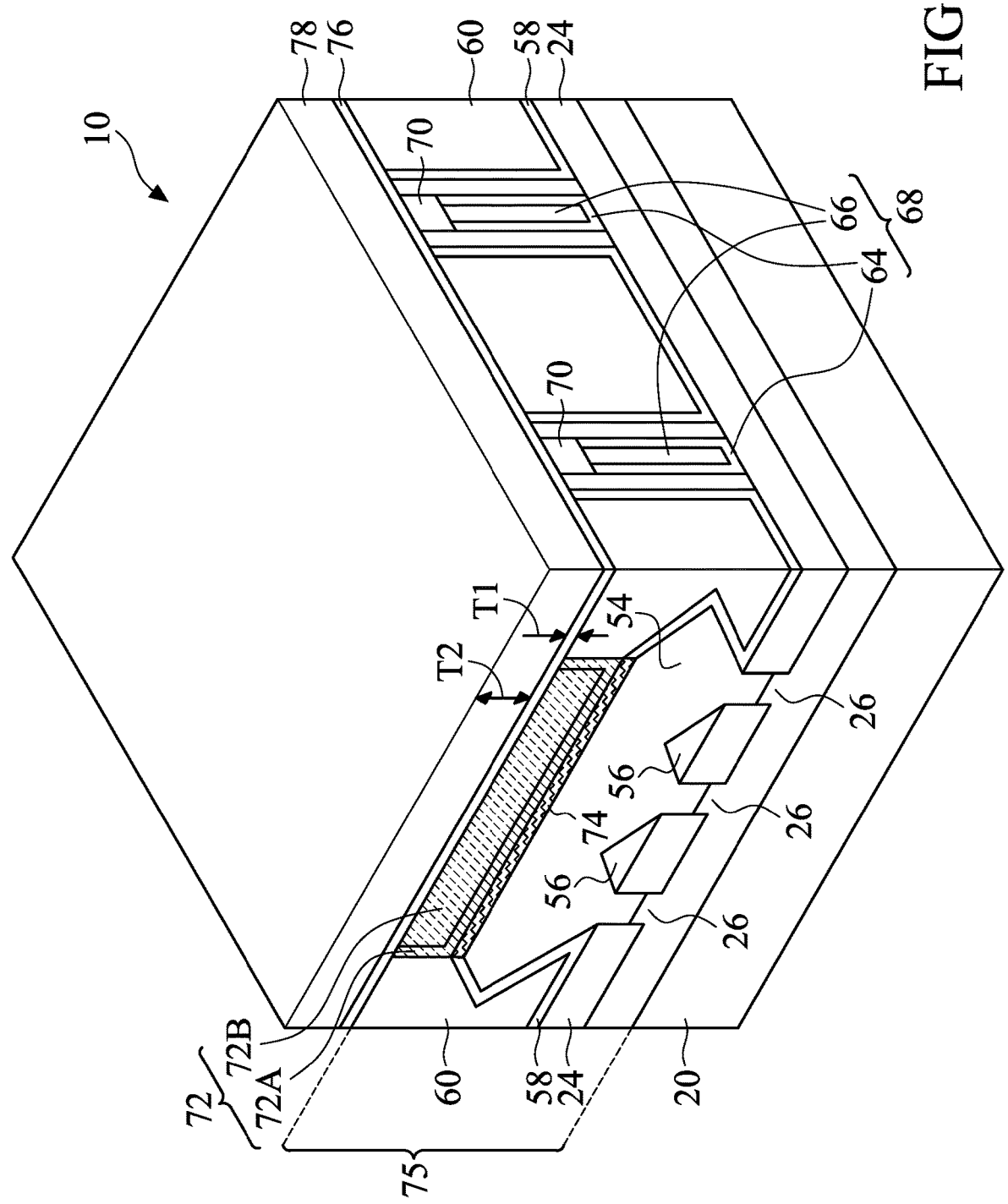
FIGS. 12, 13, 14A, 14B, 15A, 15B, 16A, 16B, 17A, 17B, 18A, 18B, 20A, and 20B illustrate the perspective views and cross-sectional views of intermediate stages in the formation of vias in accordance with some embodiments.

Referring to FIG. 12, etch stop layer 76 is formed. In accordance with some embodiments of the present disclosure, etch stop layer 76 is formed of a dielectric material, which may include silicon nitride, aluminum oxide, or the like. The thickness T1 of etch stop layer 76 may be in the range between about 1 nm and about 5 nm. Dielectric layer 78 is deposited over etch stop layer 76. The processes for forming etch stop layer 76 and dielectric layer are illustrated as process 424 in the process flow 400 shown in FIG. 38. In accordance with some embodiments, dielectric layer 78 is formed of a low-k dielectric material, which may be a silicon oxide based dielectric material formed of or comprising silicon oxide, PSG, BSG, BPSG, fluorine-doped silicate glass (FSG), a carbon-containing low-k dielectric material, Hydrogen SilsesQuioxane (HSQ), MethylSilsesQuioxane (MSQ), or the like. The thickness T2 of dielectric layer 78 may be in the range between about 10 nm and about 150 nm.

Figure 13:
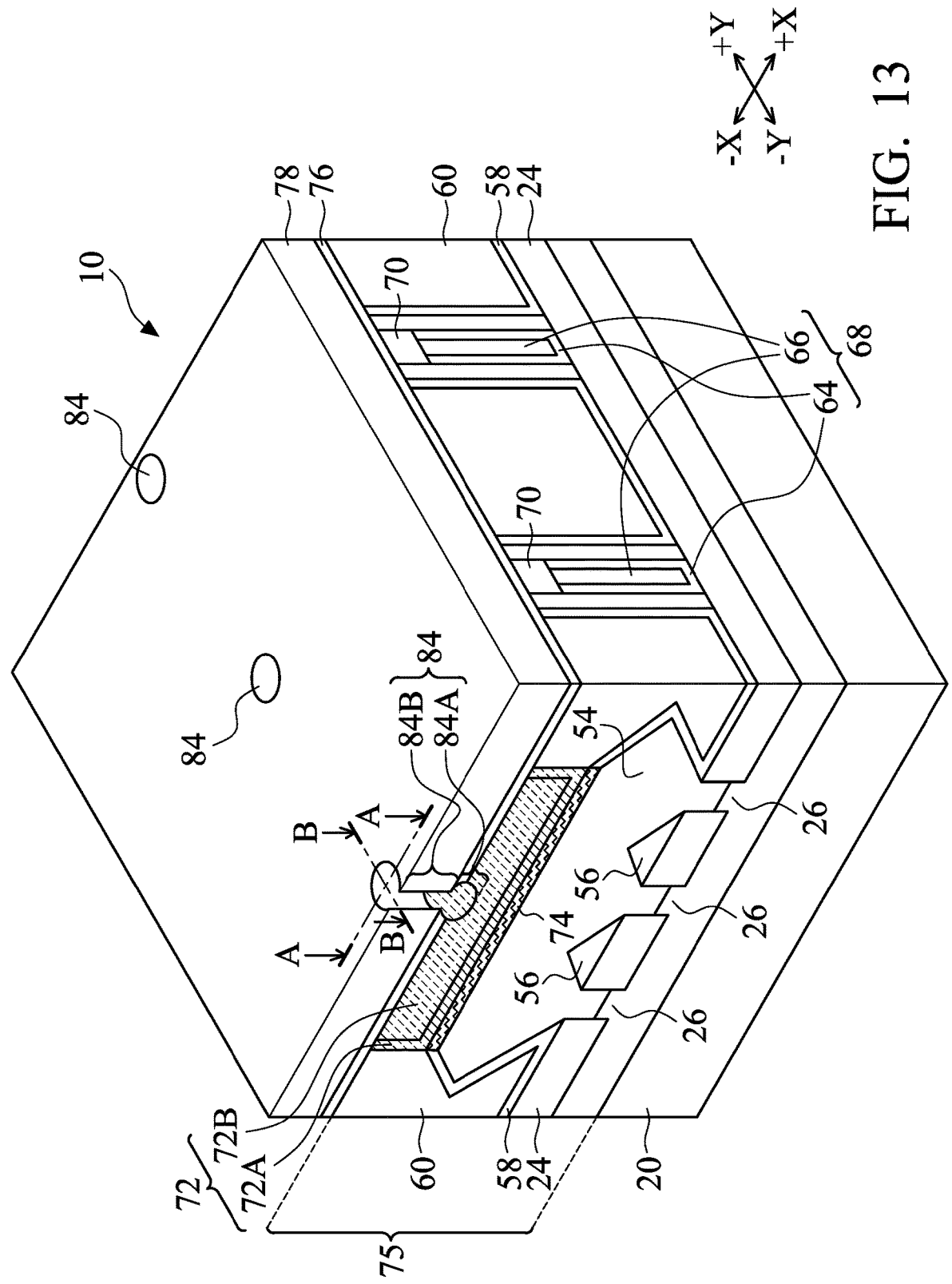

Referring to FIG. 13, via openings 84 are formed by etching through dielectric layer 78 and etch stop layer 76. Via openings 84 include lower portions 84A and upper portion 84B, with lower portions 84A being wider than the respective upper portions 84B. The process for forming via openings 84 in accordance with some example embodiments are illustrated in FIGS. 14A, 14B, 15A, 15B, 16A, and 16B. In subsequent figures, when a figure number includes digits followed by letter "A," the figure illustrates the cross-sectional view obtained from reference cross-section A-A in FIG. 13, and the cross-sectional view is also referred to as an X-Cut cross-sectional view since the cut is made parallel to the X-directions (including +X and −X directions) in FIG. 13. When a figure number includes digits followed by letter "B," the figure illustrates the cross-sectional view obtained from reference cross-section B-B in FIG. 13, and the cross-sectional view is also referred to as a Y-Cut cross-sectional view since the cut is made parallel to the Y-directions (including +Y and −Y directions) in FIG. 13. The X-directions and Y-directions are also illustrated in the subsequently discussed figures.

Figure 14A:
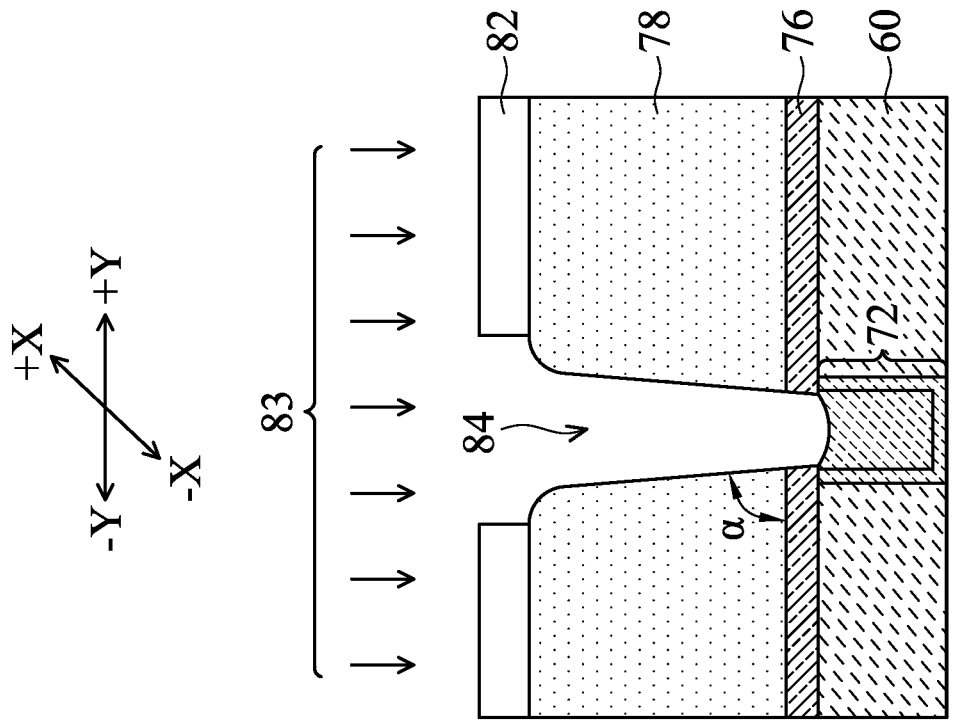
Figure 14B:
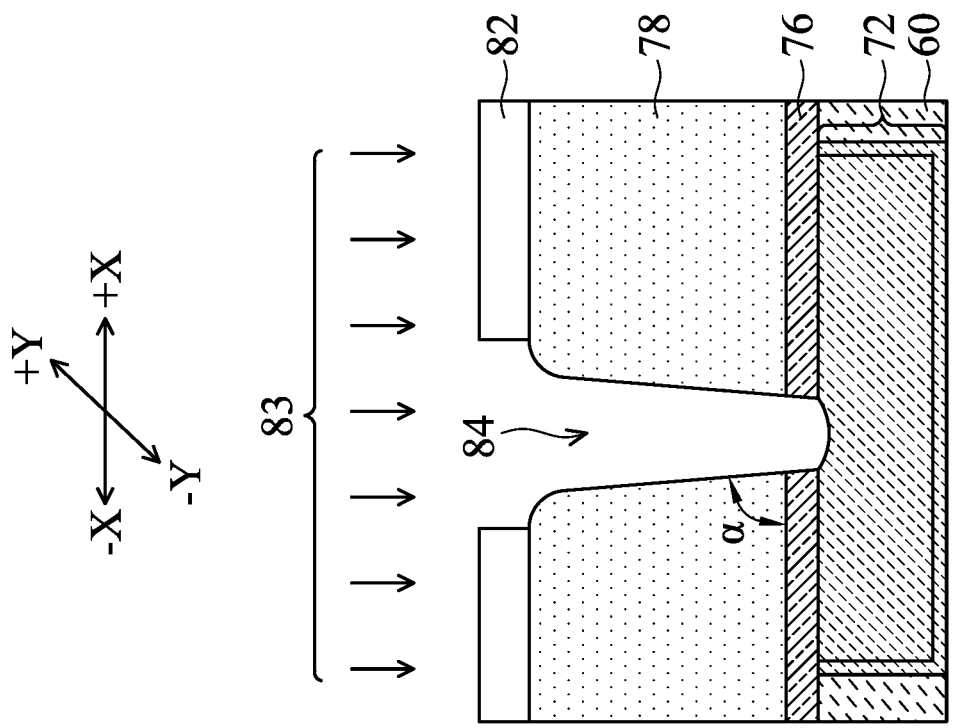

FIGS. 14A and 14B illustrate a first etching process 83 to etch-through dielectric layer 78 and etch stop layer 76, so that openings 84 are formed. The respective process is illustrated as process 426 in the process flow 400 shown in FIG. 38. The first etching process is an anisotropic etching process, and may be a dry etching process. An etching mask 82 such as a patterned photo resist is formed to define openings 84. The first etching process may be performed using a first etching gas to etch through dielectric layer 78, and stopping on etch stop layer 76. The etching gases are then changed to etch-through etch stop layer 76. The etching gases are selected accordingly to the materials of dielectric layer 78 and etch stop layer 76. For example, dielectric layer 78 may be etched using the mixed gases of $NF_3$ and $NH_3$, the mixed gases of HF and $NH_3$, or the like. Etch stop layer 76 may be etched using the mixed gases of $CF_4$, $O_2$, and $N_2$, the mixed gases of $NF_3$ and $O_2$, the mixed gases of $SF_6$ and $O_2$, or the like. After the etch stop layer 76 is etched through, a clean process may be performed to remove the polymer generated in the etching process. The clean process may be performed using oxygen ($O_2$) or the mixture of $H_2$ and $N_2$, with plasma generated, followed by a wet clean process using De-ionized water. The clean process may cause the etching of openings 84 to extend down slightly into source/drain contact plug 72.

After the first etching process, etching mask 82 may be removed. Openings 84 formed in the first etching process may have straight edges, which may be vertical or substantially vertical, for example, with tilt angle α being in the range between about 88 degrees and 90 degrees.

Figures 15A, 15B:
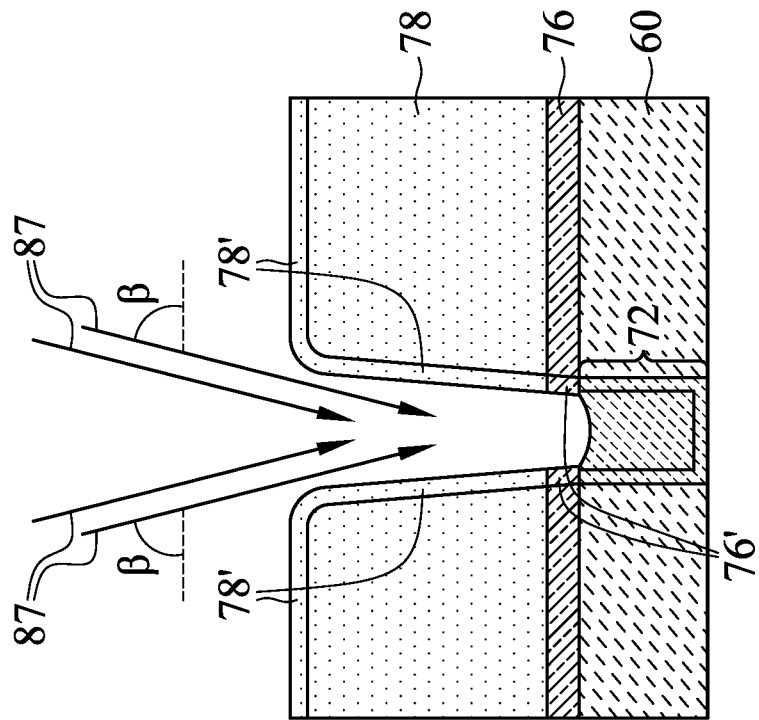

Next, as shown in FIG. 15B, tilted implantations 87 are performed. The respective process is illustrated as process 428 in the process flow 400 shown in FIG. 38. In the plane view of the structure shown in FIG. 15B, the tilt implantations 87 are performed with components parallel to the Y-direction (which is parallel to the source-to-drain direction). Tilted implantations 87 include a first implantation tilt to the +Y direction, and a second implantation tilt to the −Y direction. The tilt angle β is selected to ensure the sidewalls of etch stop layer 76 are implanted, and are not blocked by dielectric layer 78. In accordance with some embodiments, the tilt angle β is in the range between about 40 degrees and about 75 degrees. The implanted portions of dielectric layer 78 and etch stop layer 76, which now includes the implanted elements, are referred to as implanted portions 78' and 76', respectively. The implanted elements are selected so that the implanted portions 78' and 76' will not be etched in the subsequently performed second etching process. In accordance with some embodiments, silicon, germanium, carbon, boron, oxygen, or the combinations thereof are implanted, and the specific element is selected according to the material of etch stop layer 76. For example, when etch stop layer 76 is formed of or comprise silicon nitride, the implanted element includes oxygen, carbon, silicon, boron, phosphorous, or combinations thereof. When etch stop layer 76 is formed of aluminum oxide, the implanted element includes nitrogen (using $N_2$ gas), for example. In accordance with some example embodiments, silicon is implanted with an energy of about 0.5 KeV to about 5 KeV, with the dosage being in the range between about $1E15/cm^2$ and about $5E15/cm^2$. After the implantation, the atomic percentage of the implanted element in the implanted portions 78' and 76' may be in the range between about 10 percent and about 50 percent.

Tilted implantations 87 do not have components parallel to the X-direction (in the plane view), and there may not be tilted implantations parallel to other directions other than the X-directions and Y-directions. Accordingly, in the cross-sectional view as shown in FIG. 15A, implantations 87 appear to be vertical. As a result, there is no implanted portion formed on the illustrated sidewalls of etch stop layer 76 and dielectric layer 78 as shown in FIG. 15A.

Figure 16B:
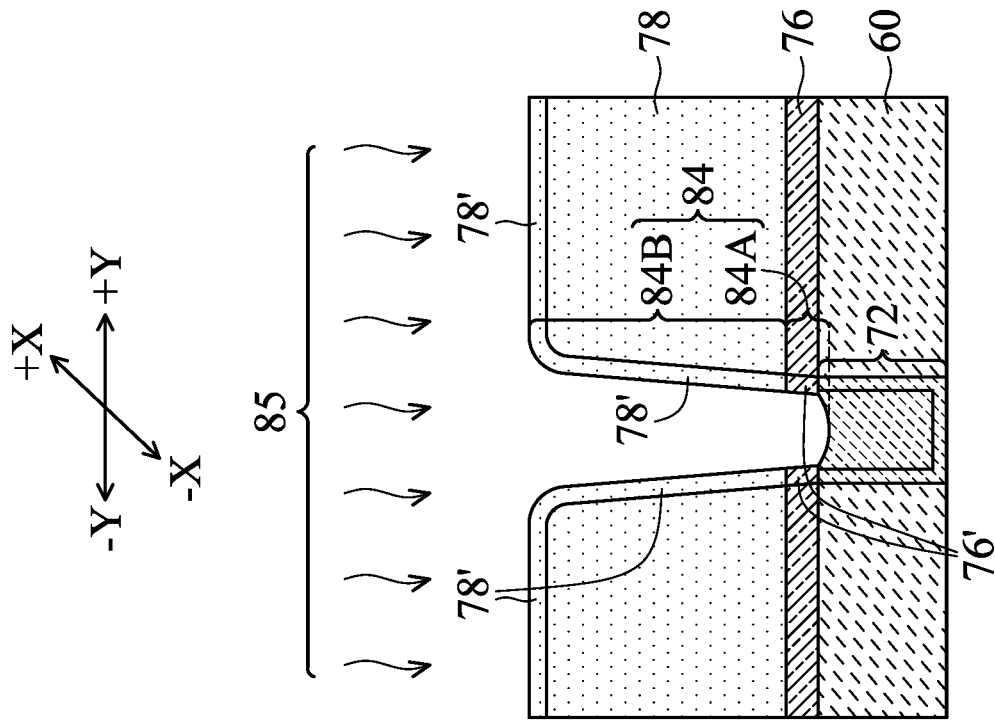
Figure 16A:
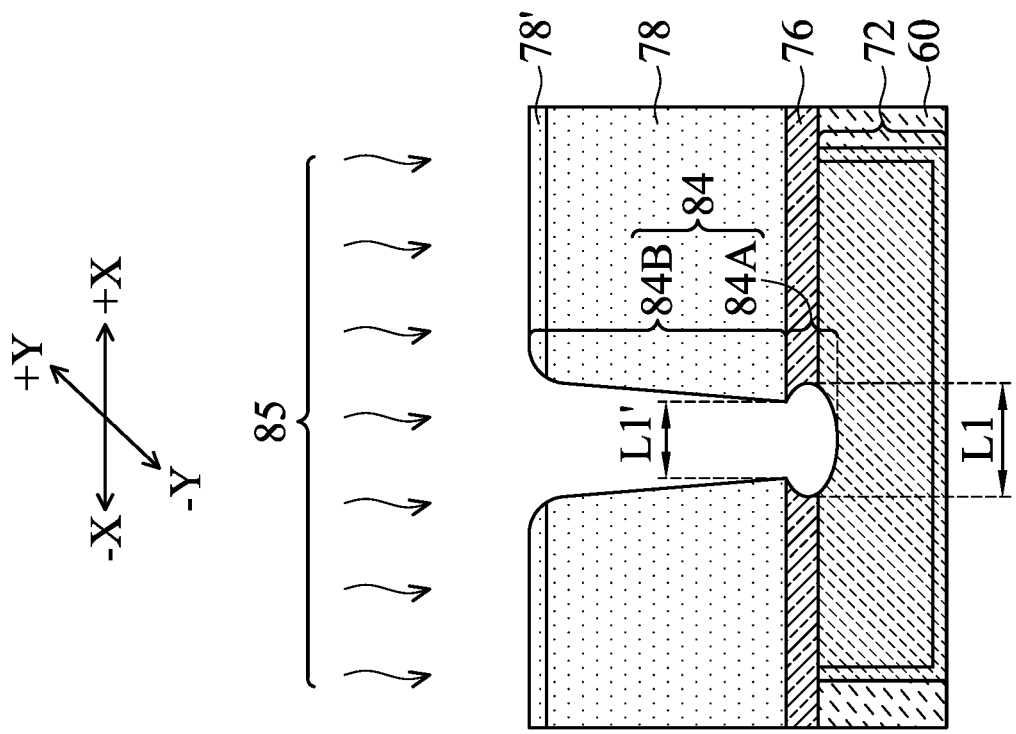

After the implantation, a second etching process 85 is performed, as shown in FIGS. 16A and 16B. The respective process is illustrated as process 430 in the process flow 400 shown in FIG. 38. The second etching process includes isotropic component, and may or may not include anisotropic component. When there is both of an anisotropic component and an isotropic component, the dominant effect is isotropic. The second etching process may include a dry etching process or a wet etching process. The etching chemical is selected to etch the un-implanted portions of etch stop layer 76, and does not etch implanted portions 76' and 78' and the un-implanted portions of dielectric layer 78. For example, when etch stop layer 76 is formed of silicon nitride, and when wet etching is used, the etching chemical may include a phosphoric acid solution ($H_3PO_4:H_2O$). The temperature of the phosphoric acid solution may be in the range between about 135° C. and about 155° C. In accordance with some embodiments in which etch stop layer 76 is formed of silicon nitride, and when dry etching is used, the etching gas may include the mixture of $CF_4$ and $H_2$, and plasma is generated. In accordance with some embodiments in which etch stop layer 76 is formed of aluminum oxide, and when wet etching is used, the etching chemical may include an ammonia solution ($NH_4OH:H_2O_2:H_2O$), which includes ammonia dissolved in hydrogen peroxide and water.

Referring to FIG. 16A, in the second etching process 85, the un-implanted portion of etch stop layer 76 is etched, and hence the lower portion 84A of opening 84 in etch stop layer 76 is expanded to be wider than the respective upper portion 84B in dielectric layer 78.

The expansion is in the X-directions, and is not in the Y-directions, as shown in FIG. 16B since the implanted portions 76' prevent the expansion. In accordance with some embodiments, length L1' of the upper via portion 88B may be in the range between about 10 nm and about 18 nm. Length L1 of the bottom via portion 88A, which length L1 may also be equal to the width of the interface between conductive via 88 and source/drain contact plug 72, may be in the range between about 12 nm and about 20 nm. The expansion amount (L1−L1') may be in the range between about 2 nm and about 10 nm. Expansion ratio (L1−L1')/L1', which reflects how much the bottom portion 88A expands beyond upper portion 88B, cannot be too big or too small. When expansion ratio (L1−L1')/L1' is too big, via 88 may also expand in the Y-directions, and via 88 may have the risk of electrically shorting (leaking) to gate contact plugs. When the ratio is too small, the purpose of reducing contact resistance is defeated. In accordance with some embodiments, expansion ratio (L1−L1')/L1' is in the range between about 0.2 and about 0.5. As shown in FIG. 16B, in the second etching process 85, the opening 84 is not expanded in the Y-directions due to the protection of implanted portions 76' and 78'.

After the second etching process 85, a pre-clean process may be performed, for example, using process gases such as hydrogen, argon, $WF_6$, and/or the like.

Figure 17A:
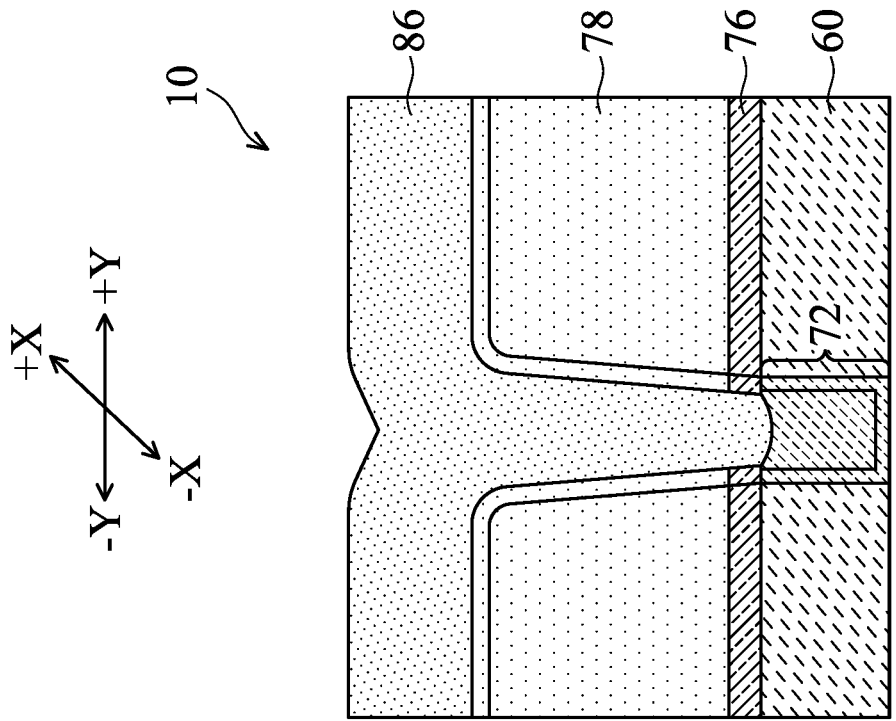
Figure 17B:
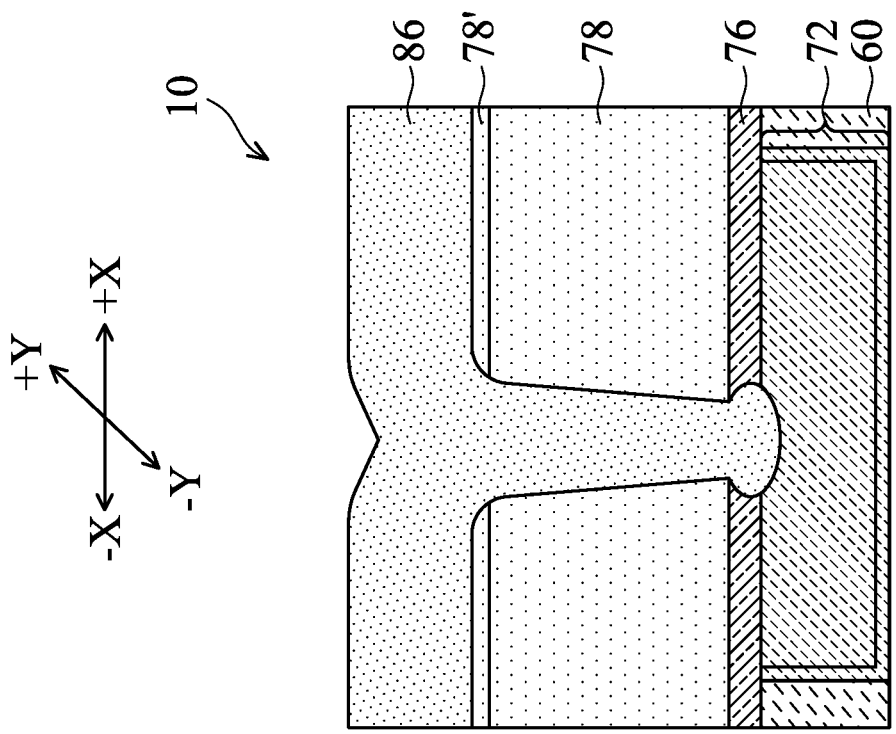

Referring to FIGS. 17A and 17B, metallic material 86 is filled into openings 84 as shown in FIGS. 16A and 16B. The respective process is illustrated as process 432 in the process flow 400 shown in FIG. 38. In accordance with some embodiments, metallic material 86 comprises a metal such as Ru, Co, Ni, Cu, Al, Pt, Mo, W, Al, Ir, Os, or combinations thereof. Metallic material 86 is deposited using a bottom-up deposition process, which may be performed using a thermal Chemical Vapor Deposition (CVD) process. The temperature of wafer 10 may be in the range between 200° C. and about 400° C. The bottom-up deposition process may be performed using $WF_6$ and $H_2$ as process gases (when tungsten is to be deposited), or use other process gases when other materials are adopted. With the bottom-up deposition, openings 84 may be filled with no air-gap generated therein. The deposition method may also include CVD, ALD, PVD, ECP, ELD, or the like.

The deposition of metallic material 86 may be performed in a temperature range between about 50° C. and about 500° C., with carrier gas including argon or nitrogen with flow rate of about 10 sccm to about 500 sccm in accordance with some embodiments. Reactant gases such as the metal-containing precursor, $H_2$, $O_2$, $NH_3$, or the like may be added, with flow rates of about 10 sccm to about 500 sccm, and pressure in the range between about 0.00001 Torr and about 10 Torr in accordance with some embodiments.

In accordance with some embodiments, metallic material 86 is formed of a homogenous material, and does not include a barrier layer. In accordance with alternative embodiments, metallic material 86 is formed of a homogenous material, and there is a conformal barrier layer (not shown) formed before metallic material 86 is deposited. The conformal barrier layer may be formed of titanium, titanium nitride, tantalum, tantalum nitride, or the like.

Figure 18A:
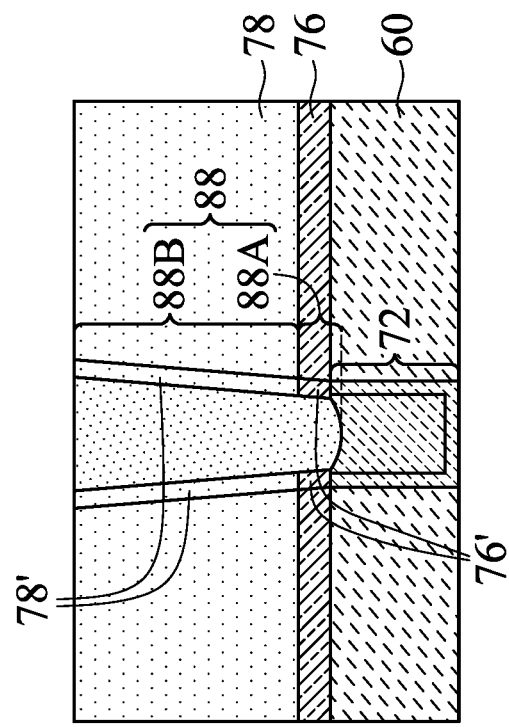
Figure 18B:
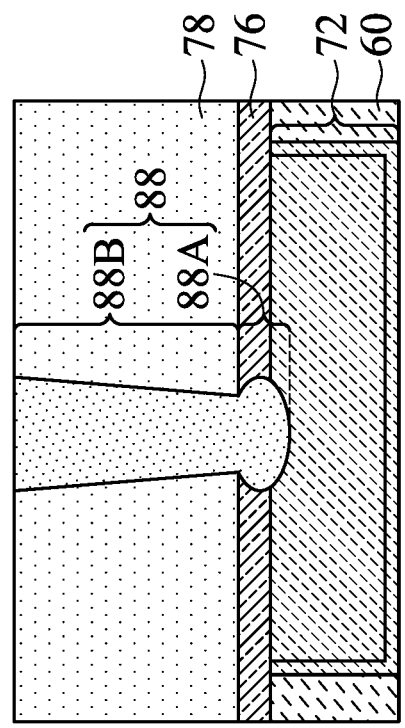

FIGS. 18A and 18B illustrate a planarization process for removing excess portions of metallic material 86, and hence conductive via 88 is formed. The respective process is illustrated as process 434 in the process flow 400 shown in FIG. 38. Conductive via 88 includes bottom (expanded) portion 88A, which extends into etch stop layer 76, and upper portion 88B, which is in dielectric layer 78. In the cross-sectional view as shown in FIG. 18A, bottom via portion 88A extends laterally beyond the respective overlaying upper portion 88A. No implanted portions 76' and 78' exist in the cross-sectional view as shown in FIG. 18A. Alternatively, substantially no implanted portions (76'/78') are formed in the cross-sectional view in FIG. 18A, for example, with the atomic percentage of the implanted elements in the sidewall portions of etch stop layer 76 and dielectric layer 78 being lower than about 5 percent or about 2 percent. In FIG. 18B, bottom via portion 88A does not extend laterally beyond the respective overlaying upper portion 88. The sidewalls of bottom via portion 88A and the sidewalls of upper portion 88B form continuous straight sidewalls extending from dielectric layer 78 into etch stop layer 76. Also, the portions of conductive via 88 shown in in FIG. 18B are in contact with the implanted portions 76' of etch stop layer 76 and the implanted portions 78' of dielectric layer 78, while the portions of conductive via 88 shown in in FIG. 18A are in contact with the un-implanted portions of dielectric layer 78 and etch stop layer 76.

Figure 19:
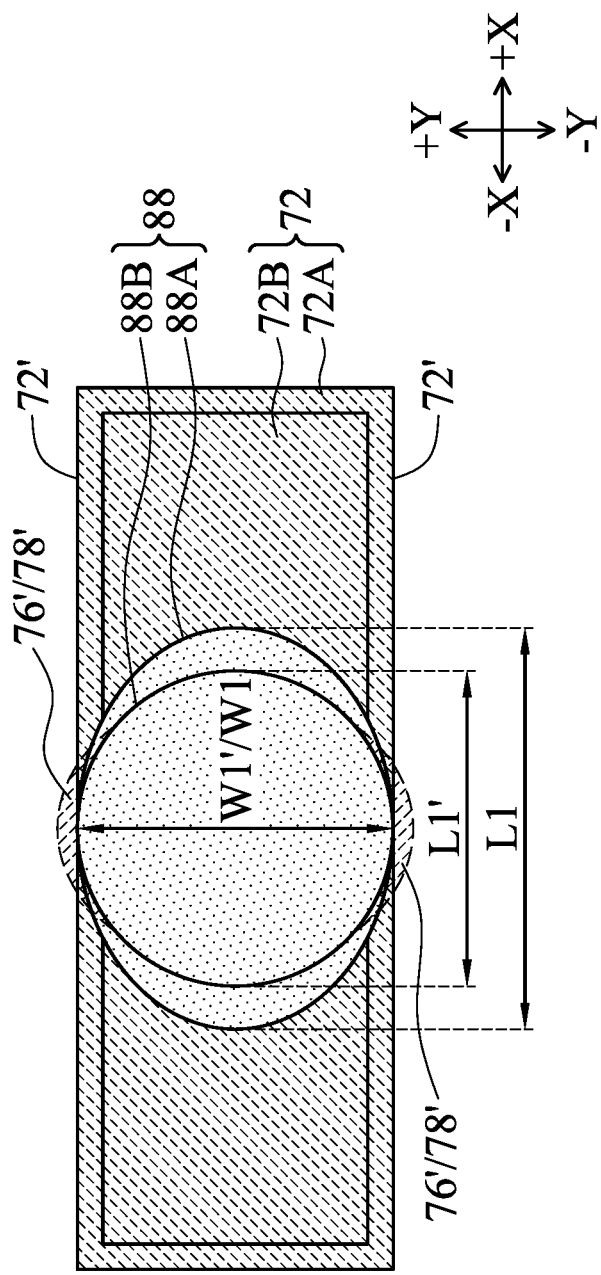
FIG. 19 illustrates a plane view of a via in accordance with some embodiments.
Figure 37:
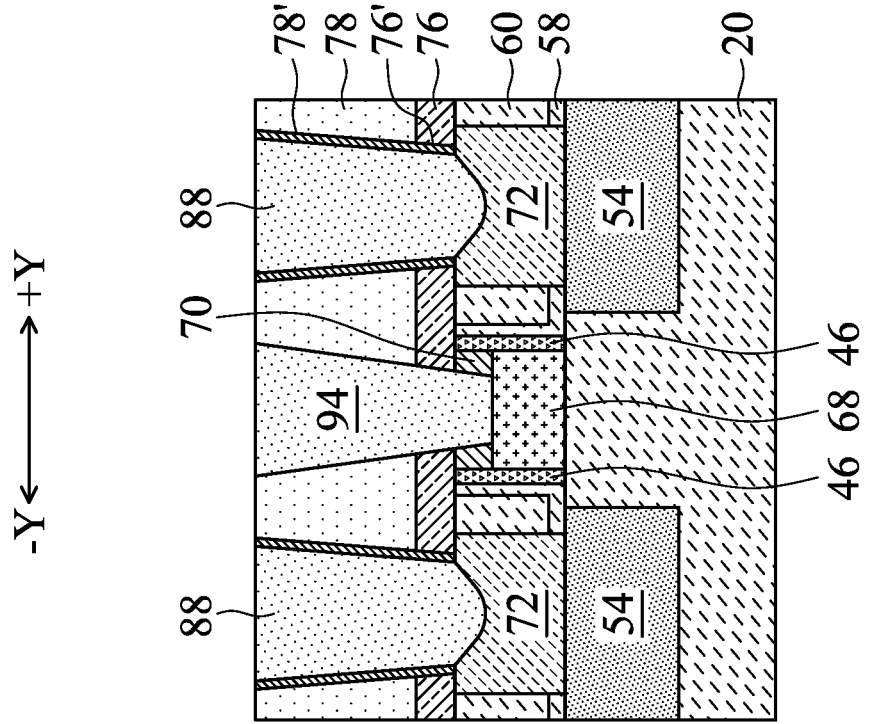
FIGS. 36 and 37 illustrate various layers of transistors in accordance with some embodiments.
Figure 36:
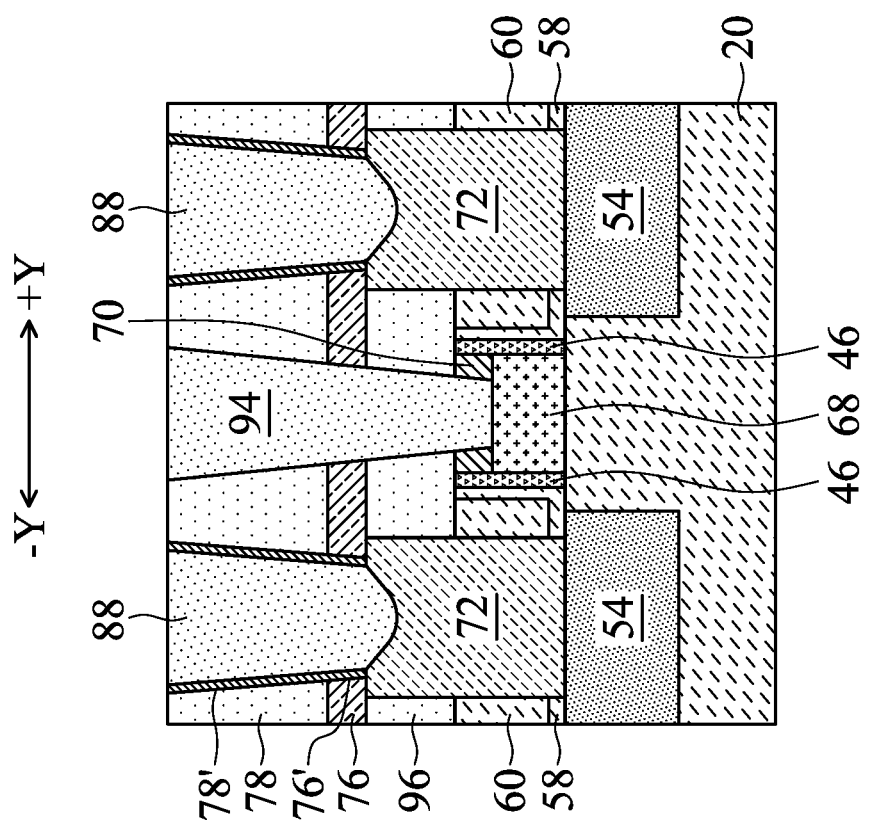

FIG. 19 illustrates a plane (top) view of conductive via 88 and the underlying source/drain contact plug 72. It is illustrated that bottom portion 88A is laterally expanded in the +X and −X directions, which are the lengthwise directions of source/drain contact plug 72. In the +Y and −Y directions, bottom portion 88A does not expand beyond upper portion 88B. The +Y and −Y directions are toward the neighboring gate contact plugs 94 (as shown in FIGS. 36 and 37). Accordingly, limiting the expansion of conductive via 88 in the +Y and −Y direction may prevent conductive via 88 from electrically shorted to the neighboring gate contact plugs 94. On the other hand, expanding the size of conductive via 88 in the +X and −X directions may increase the contact area between conductive via 88 and sourced/drain contact plug 72, and hence resulting in the desirable reduction of contact resistance. In accordance with some embodiments, in the plane view, conductive via 88 does not extend beyond the edges 72' of source/drain contact plug 72 in the +Y and −Y directions.

In accordance with some embodiments, in the plane view, the dimension of upper portion 88B is non-elongated, for example, with length L1' and width W1' being equal to each other, or substantially equal to each other. Throughout the description, unless specified otherwise, when a first dimension is referred to as substantially equal to the second dimension, the difference between the first and the second dimension is smaller than about 5 percent of both of the first and the second dimensions. The bottom portion 88A is elongated, with length L1 and width W1 having the ratio L1/W1 being greater than 1.0, and greater than about 1.05. Ratio L1/W1 may be in the range between about 1.2 and about 2. FIG. 19 also schematically illustrates the implanted portions 76' of etch stop layer 76 and the implanted portions 78' of dielectric layer 78.

Figure 33:
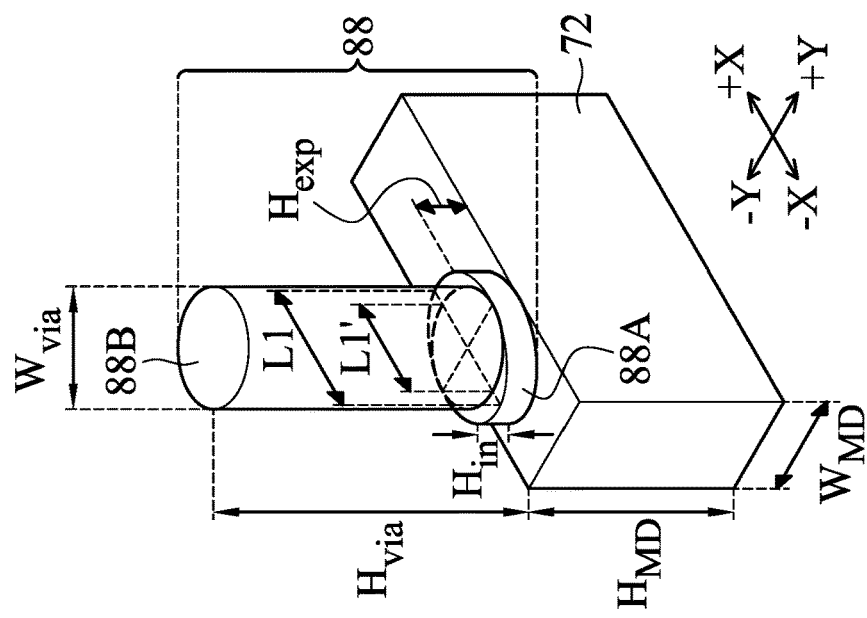

FIG. 33 illustrates a perspective view of conductive via 88 and source/drain contact plug 72, In accordance with some embodiments, width $W_{MD}$ of source/drain contact plug 72 is in the range between about 2 nm and about 20 nm. The height $H_{via}$ of via 88 may be in the range between about 10 nm and about too nm. The aspect ratio of source/drain contact plug 72, which is the ratio $H_{MD}/W_{MD}$, may be in the range between about 5 and 30, with $H_{MS}$ being the height of source/drain contact plug 72. The aspect ratio $H_{via}/L1'$ of conductive via 88 may be in the range between about 2 and 15. The ratio $H_{exp}/H_{via}$, with $H_{exp}$ being the height of bottom via portion 88A, may be in the range between about 0.03 and about 0.2.

Figure 20B:
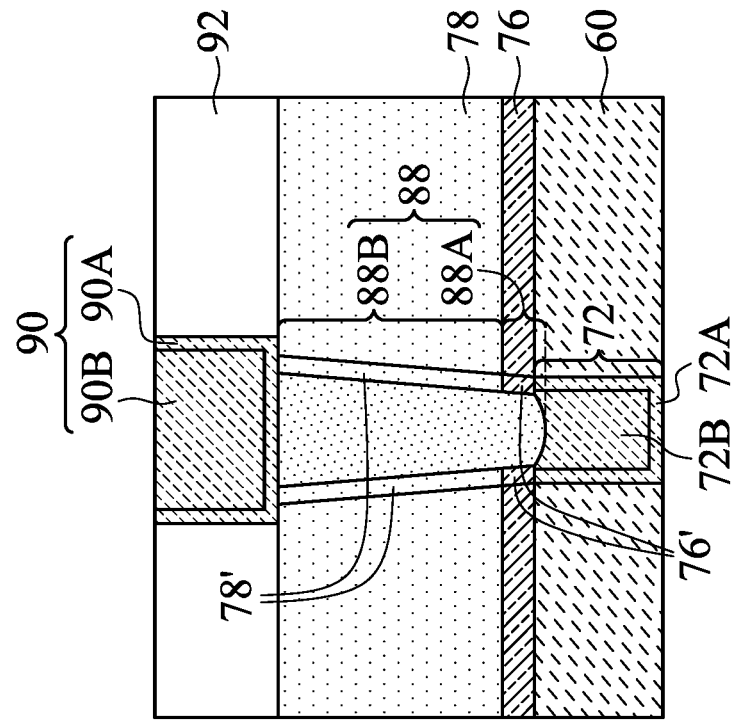
Figure 20A:
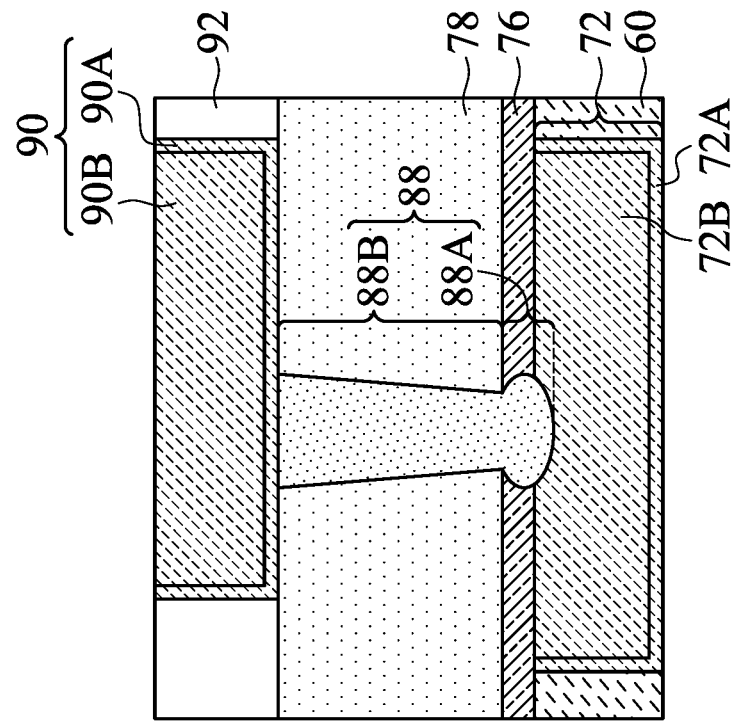

FIGS. 20A and 20B illustrate the cross-sectional views of metal line 90 and dielectric layer 92. Metal line 90 may include barrier layer 90A and metallic material 90B. Barrier layer 90A may be formed of Ti, TiN, Ta, TaN, or the like, and metallic material 90B may be formed of copper, a copper alloy, or the like. The formation of metal line 90 may adopt a damascene process. Dielectric layer 92 may be an Inter-Metal Dielectric (IMD), and may be formed of a low-k dielectric material.

FIGS. 21A and 21B through 25A and 25B illustrate cross-sectional views of intermediate stages in the formation of via 88 in accordance with alternative embodiments of the present disclosure. Unless specified otherwise, the materials and the formation processes of the components in these embodiments are essentially the same as the like components, which are denoted by like reference numerals in the preceding embodiments shown in FIGS. 14A and 14B through FIGS. 20A and 20B. The details regarding the formation process and the materials of the components shown in FIGS. 21A and 21B through FIGS. 25A and 25B (and FIGS. 26A and 26B through 30A and 30B) may thus be found in the discussion of the preceding embodiments. The initial steps of these embodiments are essentially the same as shown in FIGS. 1-6, 7A, 7B, and 8-12.

Figure 21A:
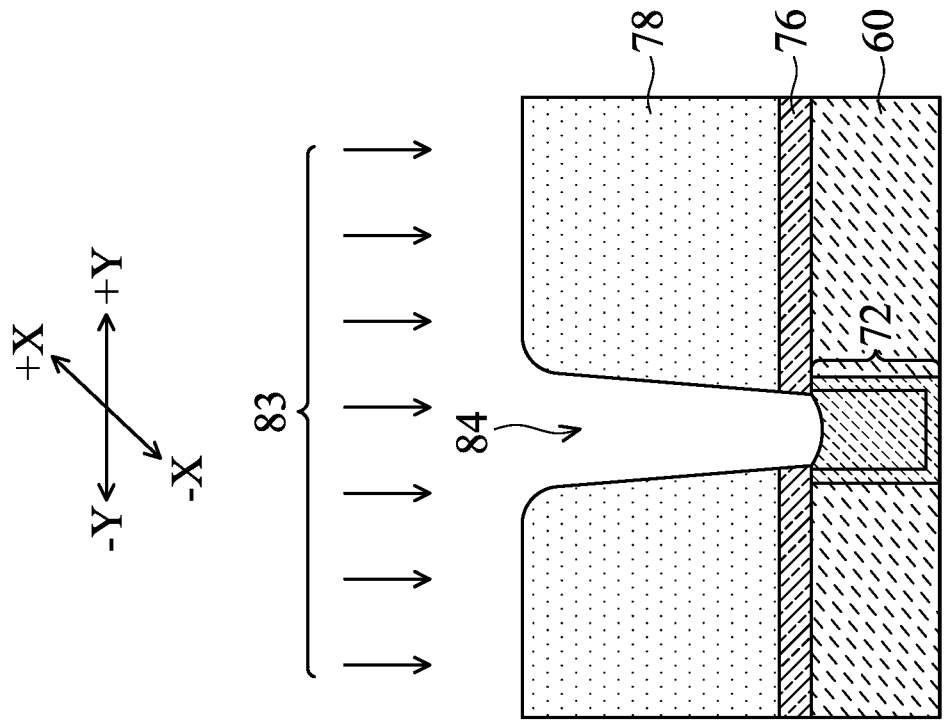
FIGS. 21A, 21B, 22A, 22B, 23A, 23B, 24A, 24B, 25A, and 25B illustrate the cross-sectional views of intermediate stages in the formation of a via in accordance with some embodiments.
Figure 21B:
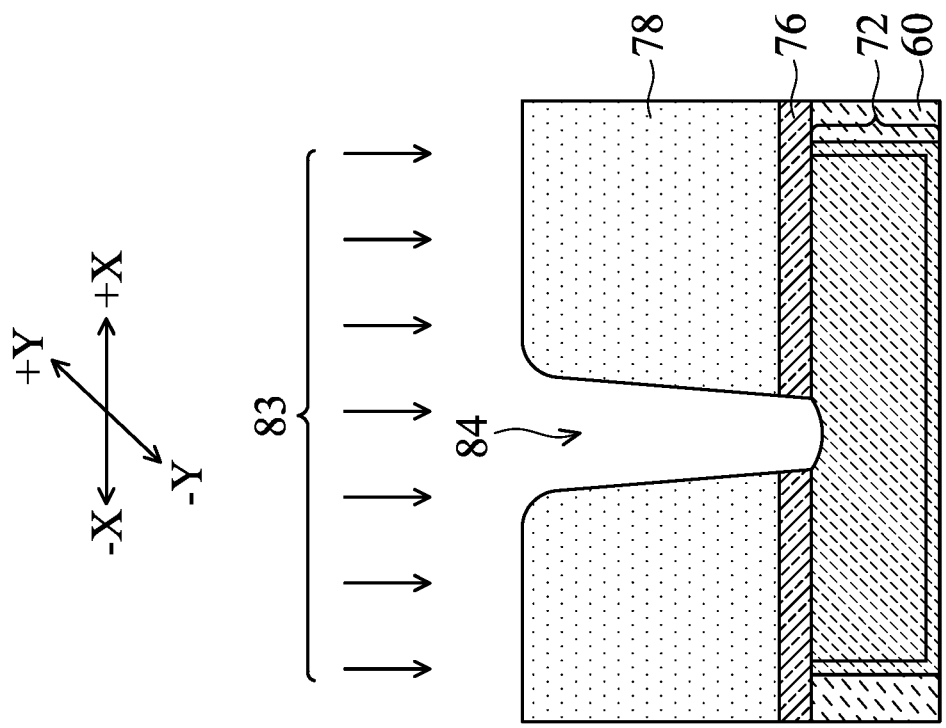
Figure 22A:
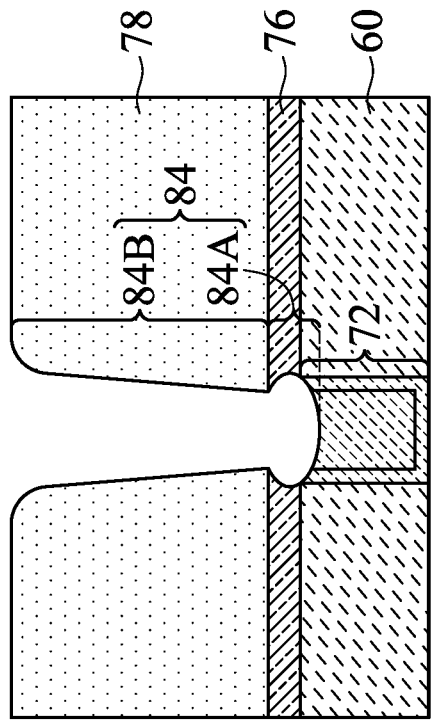
Figure 22B:
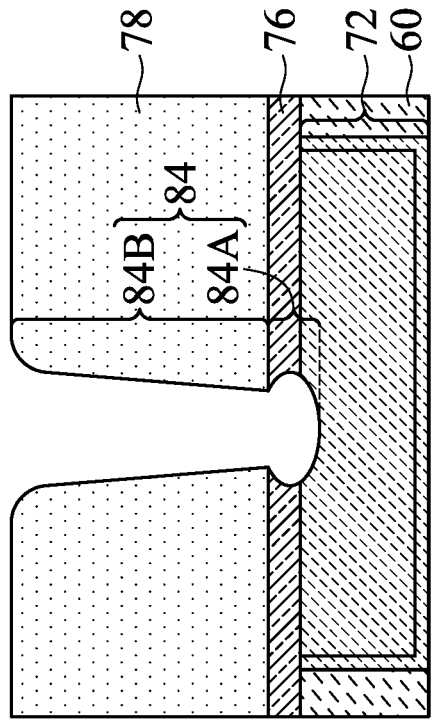
Figure 25A:
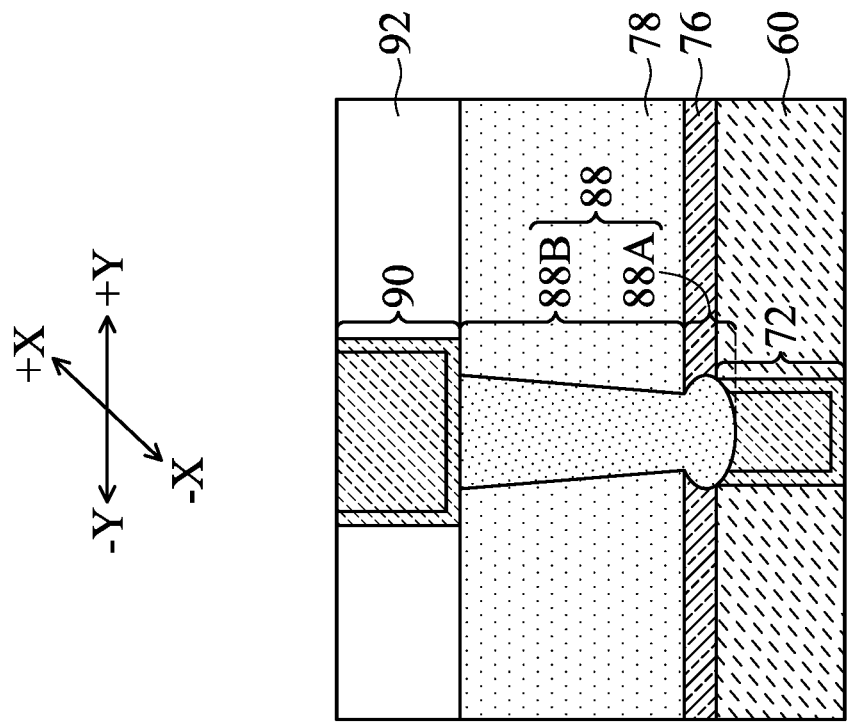
Figure 25B:
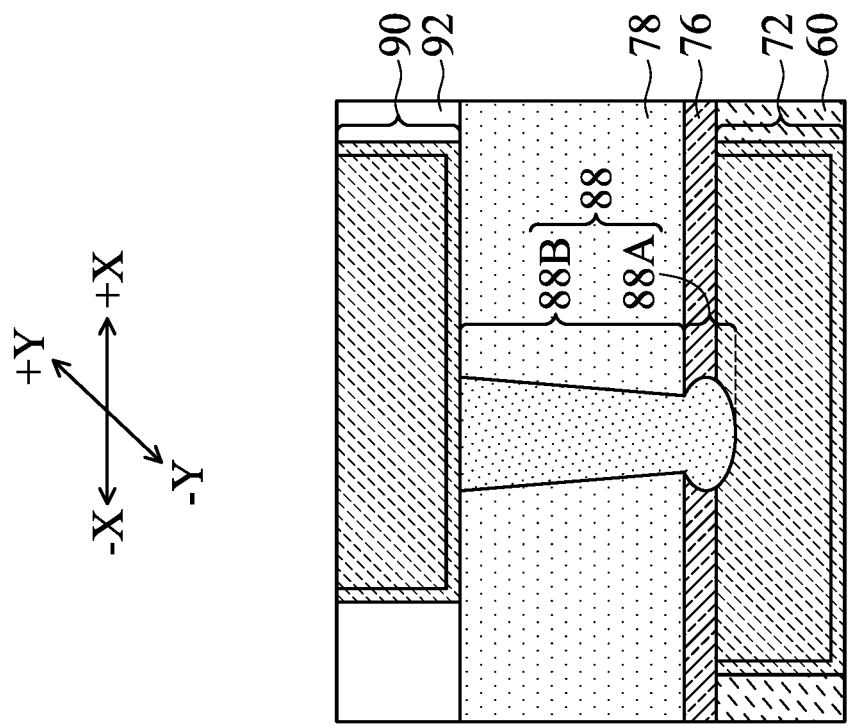

The embodiments shown in 21A and 21B through FIGS. 25A and 25B are similar to the embodiments shown in FIGS. 14A and 14B through FIGS. 20A and 20B, except the implantation process 87 as shown in FIGS. 15A and 15B is not performed, and hence bottom via portion 88A expands in both of the X-directions and Y-directions. Referring to FIGS. 21A and 21B, dielectric layer 78 and etch stop layer 76 are deposited. Dielectric layer 78 and etch stop layer 76 are then etched in the first etching process 83 to reveal source/drain contact plug 72. The etching is anisotropic. Next, as shown in FIGS. 22A and 22B, the second etching process 85 is performed. The first etching process may be similar or the same as the first etching process 83 as shown in FIGS. 14A and 14B, and the second etching process may be similar or the same as the second etching process 85 as shown in FIGS. 16A and 16B. The details of the first and the second etching processes are thus not repeated herein. Since there is no implantation performed, there is no implanted portions 76' to block the etching of the etch stop layer 76 in the Y-directions. Accordingly, as shown in FIGS. 22A and 22B, lower opening portions 84A expand beyond the edges of the upper portions 84B in both of the X-directions and Y-directions.

Figure 23A:
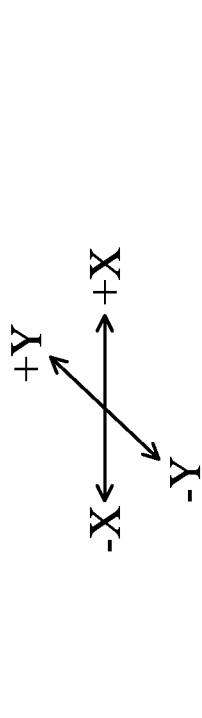
Figure 23B:
Figures 24A, 24B:
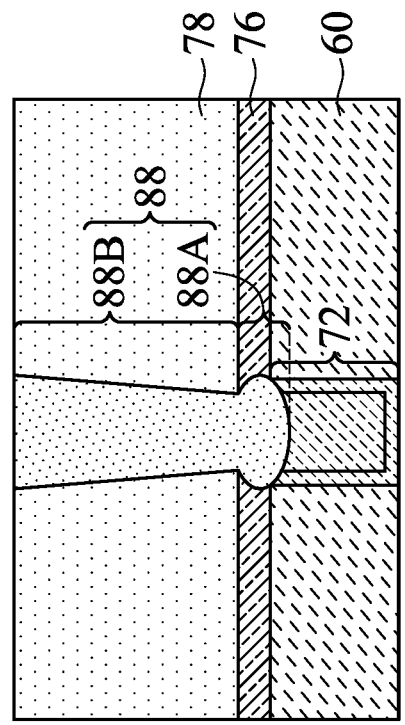

Next, opening 84 is filled with metallic material 86, as shown in FIGS. 23A and 23B, followed by a planarization process to remove excess portions of metallic material 86, as shown in FIGS. 24A and 24B. Via 88 is thus formed. FIGS. 25A and 25B illustrate the formation of dielectric layer 92 and metal line 90 therein, for example, using a damascene process.

Figure 26:
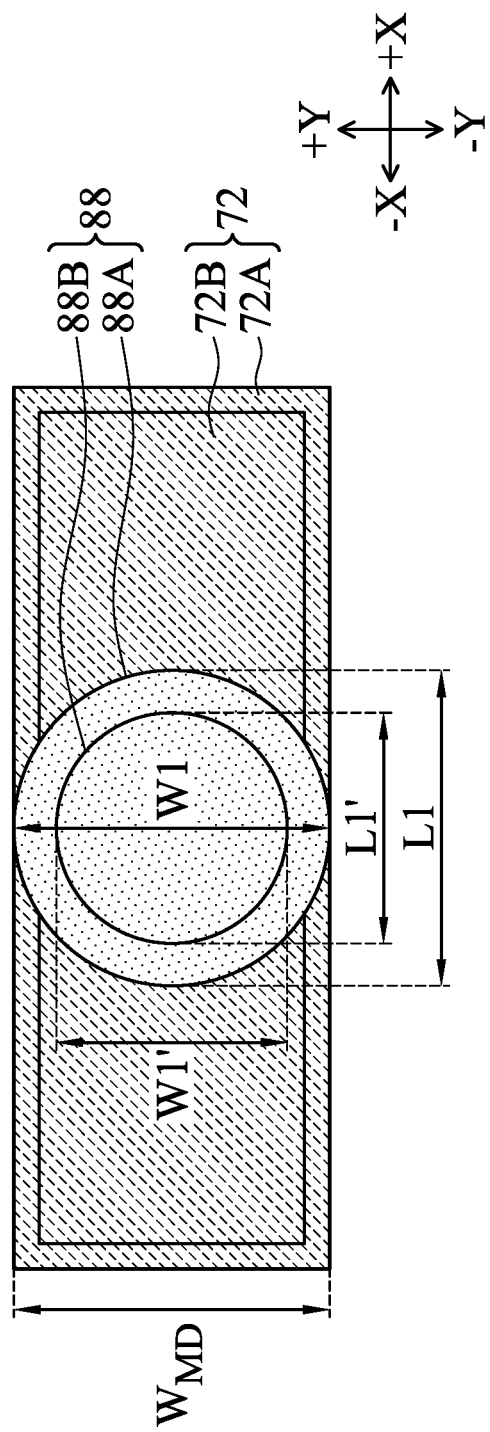
FIG. 26 illustrates a plane view of a via in accordance with some embodiments.

FIG. 26 illustrates a plane view of via 88. In accordance with some embodiments of the present disclosure, the upper portion 88B of via 88 has length L1' and width W1', which are smaller than the respective length L1 and width W1 of the bottom portion 88A. Width W1 is also equal to, substantially equal to, or smaller than the width $W_{MD}$ of the underlying source/drain contact plug 72. When width W1 is equal or substantially equal to width $W_{MD}$ of source/drain contact plug 72, the contact area is maximized without the increase in the risk of shorting to gate contact plug.

Figure 34:
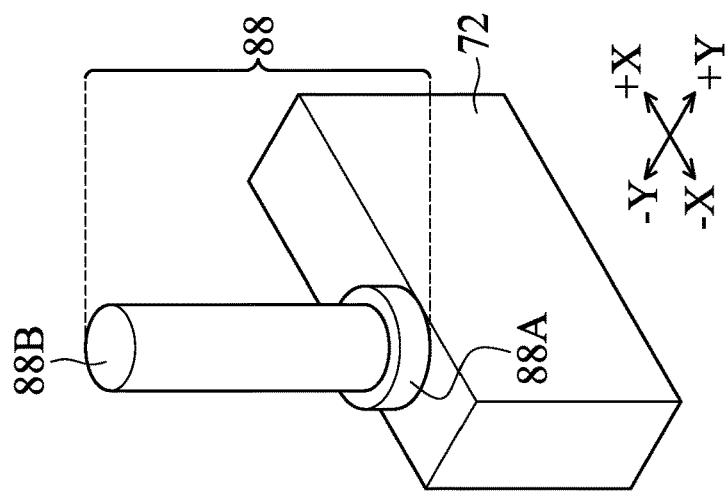

Length L1 may be equal to or substantially equal to width W1, and length L1' may be equal to or substantially equal to width W1'. As shown in FIG. 26, in the plane view, bottom portion 88A may be expanded beyond the upper portion 88B in all directions. FIG. 34 schematically illustrates a perspective view of via 88 and source/drain contact plug 72 corresponding to FIG. 26.

FIGS. 27A and 27B through 30A and 30B illustrate the formation of via 88 in accordance with alternative embodiments. These embodiments are similar to the embodiments shown in preceding Figures, except that the top portion of via 88 is also expanded, so that the contact area between via 88 and the overlying metal line 90 is also increased. Also, in some illustrated embodiments, the implantation process (FIG. 15B) is not shown, and in accordance with alternative embodiments, the implantation process may also be performed.

Referring to FIGS. 27A and 27B, etch stop layer 76 and dielectric layer 78 are formed. Furthermore, dielectric layer 79 is formed over dielectric layer 78. The material of dielectric layer 79 may have similar property as that of etch stop layer 76, so that when etch stop layer 76 is etched in the second etching process, dielectric layer 79 is also etched. The material of dielectric layer 79 may be selected from the same group of candidate materials of etch stop layer 76, and may be the same or different from the material of etch stop layer 76.

Figure 28A:
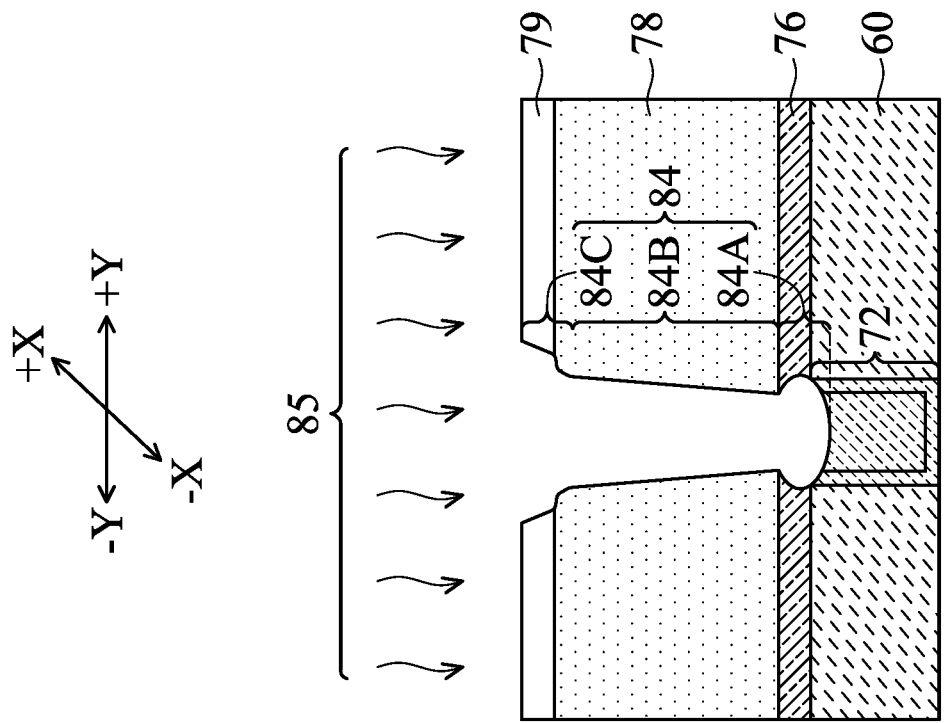
Figure 28B:
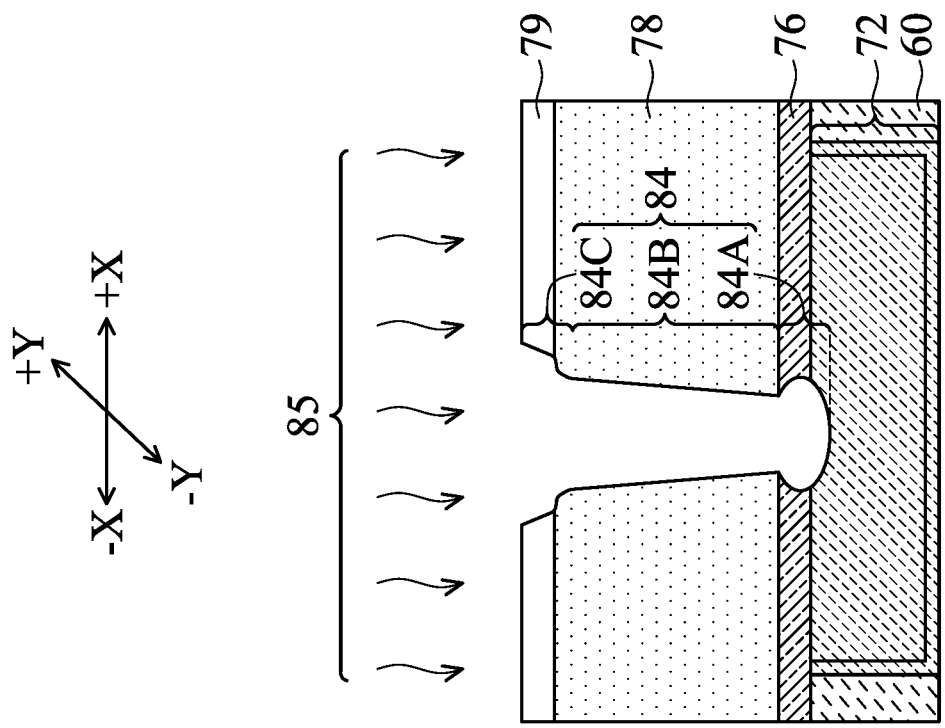

FIGS. 27A and 27B further illustrate the first etching process 83 for forming via opening 84, which penetrates through dielectric layers 79 and 78 and etch stop layer 76. Next, as shown in FIGS. 28A and 28B, the second etching process 85 is performed to expand the portions of opening 84 in etch stop layer 76. In addition, the portion 84C of opening 84 in dielectric layer 79 is also laterally expanded since dielectric layer 79 has similar etching property as etch stop layer 76. Between the first etching process 83 and the second etching process 85, the implantation process (refer to FIGS. 15A and 15B) may be performed or may not be performed. When the implantation is not performed, as shown in FIG. 28B, opening portion 84C is laterally expanded in the Y-directions. When the implantation is performed, etch stop layer 76 and dielectric layers 78 and 79 will have implanted portions 76', 78', and 79', as illustrated in FIG. 27B using dashed lines. The implanted portions 76', 78', and 79' will prevent opening 84 from laterally expanding in the Y-directions. The resulting opening 84 in the Y-cut will be similar to what is shown in FIG. 27B.

Figures 29A, 29B:
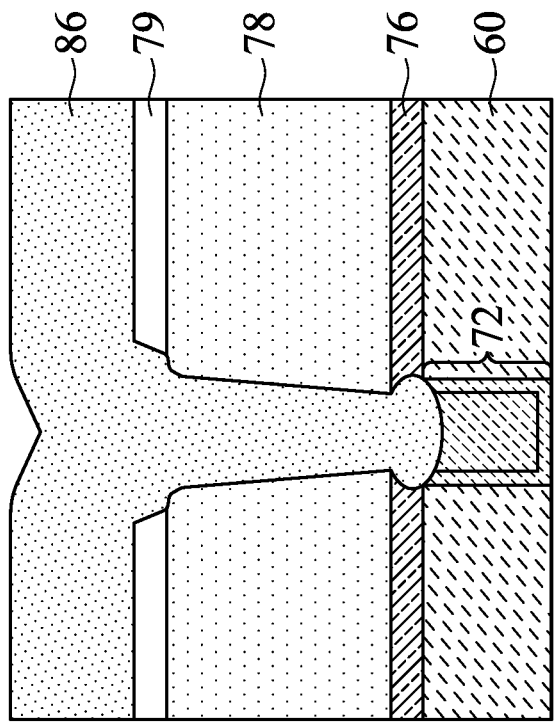
Figures 30A, 30B:
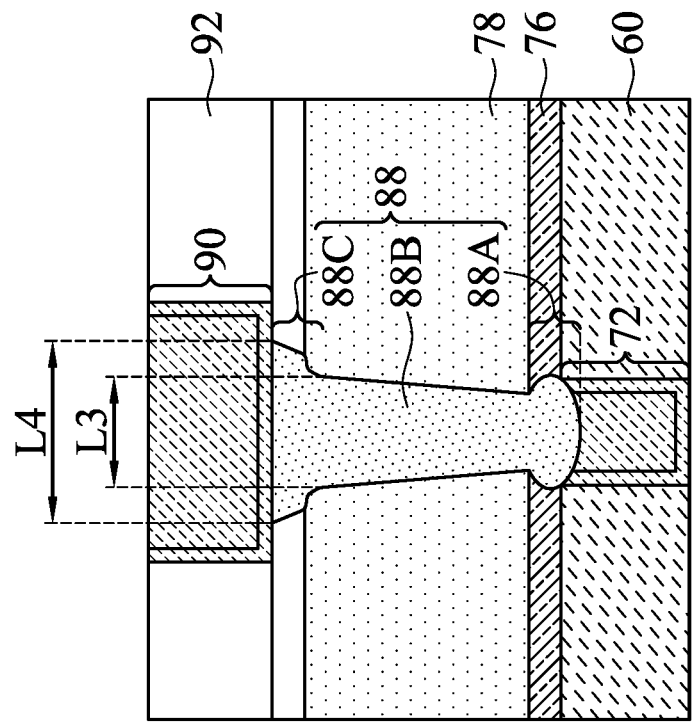

Next, as shown in FIGS. 29A and 29B, metallic material 86 is deposited to fill opening 84, followed by a planarization process to remove excess portions of metallic material 86, as shown in FIGS. 30A and 30B. Via 88 is thus formed. Via 88 further includes top portion 88C, and both of bottom portion 88A and top portion 88C are laterally expanded beyond the upper portion (also referred to as middle portion) 88B. In accordance with some embodiments, lateral expansion ratio (L4−L3)/L3 may be in the range between about 0.3 and about 1.2, wherein length L3 is the top length of the middle portion 88B, and length L4 is the top length of top portion 88C. FIGS. 30A and 30B further illustrate the formation of dielectric layer 92 and metal line 90 therein, for example, using damascene process.

FIG. 31 illustrates a plane view of via 88 when no implantation is performed between the first and the second etching processes. FIG. 31 schematically illustrates that both of top portion 88C and bottom portion 88A expand laterally beyond edges of middle portion 88B in all lateral directions when no implantation is performed. The top views of bottom portion 88A, middle portion 88B, and top portion 88C may be circles with lengths equal to the respective widths.

Figure 35:
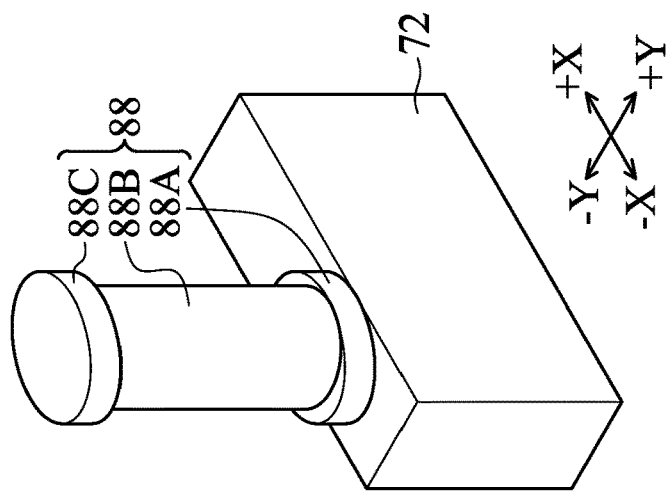
FIGS. 33, 34, and 35 illustrate the perspective views of vias and the underlying source/drain contact plugs in accordance with some embodiments.

FIG. 32 illustrates a plane view of via 88 when an implantation (as shown in FIGS. 15A and 15B) is performed between the first and the second etching processes. FIG. 32 schematically illustrates that both of top portion 88C and bottom portion 88A expand in the X-directions beyond the respective edges of middle portion 88B, and does not expand in the Y-directions. FIG. 35 schematically illustrates a perspective view of via 88 and source/drain contact plug 72 corresponding to the via 88 shown in FIG. 32.

FIGS. 36 and 37 schematically illustrate gate contact plugs 94 and their relationship with via 88 and other features in accordance with some embodiments. For example, as shown in FIG. 36, ILD 96 is formed over ILD 60, and source/drain contact plugs 72 penetrate through ILDs 60 and 96. In accordance with alternative embodiments, as shown in FIG. 37, source/drain contact plug 72 is formed in ILD 60, and the ILD 96 as shown in FIG. 36 is not formed in FIG. 37.

The embodiments of the present disclosure have some advantageous features. By expanding the bottom portions of vias, the contact area between the vias and the underlying conductive features such as source/drain contact plugs may be increased, and contact resistance is accordingly reduced. By expanding the top portions of vias, the contact area between the vias and the overlying conductive features such as metal lines may be increased to reduce the contact resistance. The effect of reducing contact resistance is significant in the vias with lengths and widths smaller than 10 nm.

In accordance with some embodiments of the present disclosure, a structure comprises a transistor comprising a first source/drain region; a source/drain contact plug over and electrically coupling to the first source/drain region; and a via over and contacting the source/drain contact plug, the via comprising: a bottom portion having a first length; and an upper portion having a second length, wherein the first length is greater than the second length, and both of the first length and the second length are measured in a first direction parallel to a top surface of the source/drain contact plug. In an embodiment, the transistor further comprises: a gate stack; and a second source/drain region, wherein the first source/drain region and the second source/drain region are on opposite sides of the gate stack, and the first direction is perpendicular to a direction pointing from the first source/drain region to the second source/drain region. In an embodiment, the bottom portion has a first width, and the upper portion has a second width smaller than the first width, and both of the first width and the second width are measured in a second direction perpendicular to the first direction. In an embodiment, the bottom portion has a first width, and the upper portion has a second width substantially equal to the first width, and both of the first width and the second width are measured in a second direction perpendicular to the first direction. In an embodiment, the structure further comprises an etch stop layer, wherein the bottom portion of the via is in the etch stop layer; and a dielectric layer over the etch stop layer, wherein the upper portion of the via is in the dielectric layer. In an embodiment, the via further comprises a top portion laterally extending beyond the upper portion, and wherein there is an abrupt change in lengths of the via from the upper portion to the top portion. In an embodiment, the structure further comprises an etch stop layer, wherein the bottom portion is in the etch stop layer; a first dielectric layer over the etch stop layer, wherein the upper portion is in the first dielectric layer; and a second dielectric layer over the first dielectric layer, wherein the top portion is in the second dielectric layer. In an embodiment, the upper portion has a substantially straight and vertical sidewall, and the bottom portion laterally extends beyond the substantially straight and vertical sidewall.

In accordance with some embodiments of the present disclosure, a structure comprises a first conductive feature, wherein in a plane view, the first conductive feature has a first length in a first direction, and a first width in a second direction perpendicular to the first direction, and the first width is smaller than the first length; and a conductive via over and contacting the first conductive feature, wherein the conductive via comprises a bottom portion, wherein the bottom portion is elongated with a second length measured in the first direction, and a second width measured in the second direction, with the second width smaller than the second length; and an upper portion over and joined to the bottom portion, wherein the upper portion has a third length measured in the first direction, and a third width measured in the second direction, with the third length being substantially equal to the third width. In an embodiment, the bottom portion and the upper portion of the conductive via comprise a same homogenous material. In an embodiment, the upper portion has straight sidewalls. In an embodiment, the second length is greater than the third length by a difference, and a ratio of the difference to the first length is in a range between about 0.2 and about 0.5. In an embodiment, the structure further comprises an etch stop layer, wherein the bottom portion is in the etch stop layer; and a dielectric layer over the etch stop layer, wherein the upper portion is in the dielectric layer. In an embodiment, the conductive via further comprises a top portion over and joined to the upper portion, wherein in the plane view, the top portion is elongated.

In accordance with some embodiments of the present disclosure, a method comprises depositing a first dielectric layer over a first conductive feature; depositing a second dielectric layer over the first dielectric layer; performing a first etching process to etch through the first dielectric layer and the second dielectric layer and to form an opening, wherein the opening comprises: a bottom portion in the first dielectric layer; and an upper portion in the second dielectric layer; performing a second etching process to expand the bottom portion to be beyond edges of the upper portion; and filling a conductive material into the opening to form a second conductive feature. In an embodiment, the first etching process comprises an anisotropic etching process, and the second etching process comprises an isotropic etching process. In an embodiment, in the second etching process, the bottom portion of the opening expands in all directions parallel to a major top surface of the first dielectric layer. In an embodiment, in the second etching process, the bottom portion of the opening expands in a first direction, and does not expand in second direction perpendicular to the first direction, wherein the first direction and the second direction are parallel to a major top surface of the first dielectric layer. In an embodiment, the method further comprises after the first etching process and before the second etching process, performing a tilt implantation to implant sidewall portions of the first dielectric layer and the second dielectric layer, wherein the sidewall portions face the opening. In an embodiment, the sidewall portions are substantially not etched in the second etching process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
    a transistor comprising a first source/drain region;
    a source/drain contact plug over and electrically coupling to the first source/drain region; and
    a via over and contacting the source/drain contact plug, the via comprising:
        a bottom portion having a first length; and
        an upper portion having a second length, wherein the first length is greater than the second length, and both of the first length and the second length are measured in a first direction parallel to a top surface of the source/drain contact plug.

2. The structure of claim 1, wherein the transistor further comprises:
    a gate stack; and
    a second source/drain region, wherein the first source/drain region and the second source/drain region are on opposite sides of the gate stack, and the first direction is perpendicular to a direction pointing from the first source/drain region to the second source/drain region.

3. The structure of claim 1, wherein the bottom portion has a first width, and the upper portion has a second width smaller than the first width, and both of the first width and the second width are measured in a second direction perpendicular to the first direction.

4. The structure of claim 1, wherein the bottom portion has a first width, and the upper portion has a second width substantially equal to the first width, and both of the first width and the second width are measured in a second direction perpendicular to the first direction.

5. The structure of claim 1 further comprising:
    an etch stop layer, wherein the bottom portion of the via is in the etch stop layer; and
    a dielectric layer over the etch stop layer, wherein the upper portion of the via is in the dielectric layer.

6. The structure of claim 1, wherein the via further comprises a top portion laterally extending beyond the upper portion, and wherein there is an abrupt change in lengths of the via from the upper portion to the top portion.

7. The structure of claim 6 further comprising:
    an etch stop layer, wherein the bottom portion is in the etch stop layer;
    a first dielectric layer over the etch stop layer, wherein the upper portion is in the first dielectric layer; and
    a second dielectric layer over the first dielectric layer, wherein the top portion is in the second dielectric layer.

8. The structure of claim 1, wherein the upper portion has a substantially straight and vertical sidewall, and the bottom portion laterally extends beyond the substantially straight and vertical sidewall.

9. A structure comprising:
    a first conductive feature, wherein in a plane view, the first conductive feature has a first length in a first direction, and a first width in a second direction perpendicular to the first direction, and the first width is smaller than the first length; and
    a conductive via over and contacting the first conductive feature, wherein the conductive via comprises:
        a bottom portion, wherein the bottom portion is elongated with a second length measured in the first direction, and a second width measured in the second direction, with the second width smaller than the second length; and
        an upper portion over and joined to the bottom portion, wherein the upper portion has a third length measured in the first direction, and a third width measured in the second direction, with the third length being substantially equal to the third width.

10. The structure of claim 9, wherein the bottom portion and the upper portion of the conductive via comprise a same homogenous material.

11. The structure of claim 9, wherein the upper portion has straight sidewalls.

12. The structure of claim 9, wherein the second length is greater than the third length by a difference, and a ratio of the difference to the first length is in a range between about 0.2 and about 0.5.

13. The structure of claim 9 further comprising:
   an etch stop layer, wherein the bottom portion is in the etch stop layer; and
   a dielectric layer over the etch stop layer, wherein the upper portion is in the dielectric layer.

14. The structure of claim 13, wherein the conductive via further comprises a top portion over and joined to the upper portion, wherein in the plane view, the top portion is elongated.

15. A structure comprising:
   a transistor comprising a source/drain region;
   a gate stack on a side of the source/drain region;
   a first conductive feature over and electrically coupling to the source/drain region, wherein the first conductive feature comprises:
      an upper portion having a first edge, wherein the first edge is substantially straight; and
      a lower portion having a second edge, wherein the second edge is curved, and wherein the upper portion and the lower portion are continuously connected to each other without distinguishable interface therebetween, wherein the lower portion has a first width, and the upper portion has a second width smaller than the first width, and both of the first width and the second width are measured in a direction that is parallel to a top surface of the source/drain region and parallel to a lengthwise direction of the gate stack.

16. The structure of claim 15, wherein the lower portion is wider than at least a bottom part of the upper portion of the first conductive feature.

17. The structure of claim 15, wherein the curved second edge has a top end and a bottom end, and wherein a largest width of the lower portion is at an intermediate level between the top end and the bottom end.

18. The structure of claim 15 further comprising:
   an etch stop layer, wherein a part of the lower portion of the first conductive feature is in the etch stop layer; and
   a dielectric layer over the etch stop layer, wherein the upper portion of the first conductive feature is in the dielectric layer.

19. The structure of claim 15 further comprising a second conductive feature between, and electrically interconnecting, the source/drain region and the first conductive feature.

20. The structure of claim 18, wherein a widest part of the lower portion of the first conductive feature is in the etch stop layer.

* * * * *